(12) United States Patent
Kawakami et al.

(10) Patent No.: US 9,678,177 B2
(45) Date of Patent: Jun. 13, 2017

(54) MAGNETIC SENSOR DEVICE FOR SUPPRESSING MAGNETIC SATURATION

(71) Applicant: HITACHI METALS, LTD., Tokyo (JP)

(72) Inventors: Makoto Kawakami, Osaka (JP); Yasunori Takaki, Osaka (JP); Yasunori Abe, Osaka (JP); Yasuhito Takeuchi, Osaka (JP)

(73) Assignee: HITACHI METALS, LTD., Tokyo (JP)

( * ) Notice: Subject to any disclaimer, the term of this patent is extended or adjusted under 35 U.S.C. 154(b) by 172 days.

(21) Appl. No.: 14/387,482

(22) PCT Filed: Mar. 13, 2013

(86) PCT No.: PCT/JP2013/057104
§ 371 (c)(1),
(2) Date: Sep. 23, 2014

(87) PCT Pub. No.: WO2013/141124
PCT Pub. Date: Sep. 26, 2013

(65) Prior Publication Data
US 2015/0048819 A1 Feb. 19, 2015

(30) Foreign Application Priority Data
Mar. 23, 2012 (JP) ................. 2012-066579

(51) Int. Cl.
*G01R 33/09* (2006.01)
*H01L 43/08* (2006.01)
*G01R 15/20* (2006.01)

(52) U.S. Cl.
CPC .......... *G01R 33/093* (2013.01); *G01R 33/09* (2013.01); *H01L 43/08* (2013.01); *G01R 15/205* (2013.01)

(58) Field of Classification Search
CPC ........ G01R 33/09; G01R 33/093; H01L 43/08
(Continued)

(56) References Cited

U.S. PATENT DOCUMENTS

| | | | | | |
|---|---|---|---|---|---|
| 5,473,491 | A | * | 12/1995 | Fujisawa | G11B 5/3116 360/125.44 |
| 6,310,470 | B1 | * | 10/2001 | Hebing | G01R 15/205 324/117 R |

(Continued)

FOREIGN PATENT DOCUMENTS

| | | |
|---|---|---|
| JP | U-3-16953 | 2/1991 |
| JP | A-8-94728 | 4/1996 |

(Continued)

OTHER PUBLICATIONS

International Preliminary Report on Patentability issued in International Application No. PCT/JP2013/057104 dated Sep. 23, 2014.

(Continued)

*Primary Examiner* — Jay Patidar
(74) *Attorney, Agent, or Firm* — Oliff PLC

(57) ABSTRACT

A magnetic sensor device comprises a thin film first magnetic body provided with a magnetic path convergence/divergence section arranged on a predetermined axis, and at least a pair of wing-shaped sections extending from the magnetic path convergence/divergence section toward the opposite sides of the axis, a thin film second magnetic body provided with a magnetic path convergence/divergence section arranged on the predetermined axis to be spaced from the magnetic path convergence/divergence section of the first magnetic body, at least a pair of wing-shaped sections extending from this magnetic path convergence divergence toward the opposite sides of the axis, a first coil wound around the first magnetic body, a second coil wound around the second magnetic body, and a magnetoresistance effect element arranged between the magnetic path convergence/

(Continued)

divergence section of the first magnetic body and the of the second magnetic body, wherein the first coil applies a magnetic field to a magnetic path of the first magnetic body, the magnetic path converging/diverging from/to the at least a pair of wing-shaped sections of the first magnetic body to/from the magnetic path convergence/divergence section the second coil applies a magnetic field to a magnetic path of the second magnetic body, the magnetic path diverging/converging from/to the magnetic path convergence/divergence section to/from the at least a pair of wing-shaped sections of the first magnetic body, and a magnetic field is applied to the magnetoresistance effect element along the converged magnetic path.

4 Claims, 44 Drawing Sheets

(58) Field of Classification Search
USPC .......................................... 324/116–126, 252
See application file for complete search history.

(56) References Cited

U.S. PATENT DOCUMENTS 7,923,999 B2 * 4/2011 Edelstein ............ G01R 33/0286
324/244

2015/0177285 A1 * 6/2015 Higashi .............. G01R 19/0092
324/144

FOREIGN PATENT DOCUMENTS

| JP | A-8-233921 | 9/1996 |
|----|------------|--------|
| JP | A-2008-128711 | 6/2008 |
| JP | A-2009-168765 | 7/2009 |
| JP | A-2009-222542 | 10/2009 |
| JP | A-2011-112634 | 6/2011 |
| JP | A-2011-174751 | 9/2011 |

OTHER PUBLICATIONS

International Search Report issued in International Application No. PCT/JP2013/057104 mailed Jun. 18, 2013.
Written Opinion of the International Searching Authority issued in International Application No. PCT/JP2013/057104 mailed Jun. 18, 2013.
Oct. 4, 2016 Office Action issued in Japanese Patent Application No. 2014-506172.
Apr. 4, 2017 Office Action issued in Japanese Patent Application No. 2014-506172.

* cited by examiner (a) : No Bias Magnetic Field (b) : Bias Magnetic Field 3979 A/m (50Oe)

(a) Type 1:

External Magnetic Field 24 Oe, FB Current 10 mA (b) Type 2:

External Magnetic Field 20 Oe, FB Current 10 mA

MAGNETIC SENSOR DEVICE FOR SUPPRESSING MAGNETIC SATURATION

TECHNICAL FIELD

The present disclosure relates to a sensor device which detects a magnetic intensity.

BACKGROUND ART

A current sensor using a plurality of linear magnetic bodies each having a longitudinal direction extending in the direction along a magnetic field to be measured, and SVGMR (Spin Valve Giant Magnetoresistive effect) elements functioning as magnetic sensing elements arranged between the adjacent magnetic bodies, has been considered.

Patent Document 1 discloses an example of a current sensor comprising a substantially circular magnetic frame having two internally projecting portions arranged so that tip portions of the projections are opposed with each other around the center of the circler frame, and magnetism detection elements arranged at the internal projections so as to be opposed with each other. The driving method of the current sensor is disclosed in, for example, Patent Document 2.

RELATED ARTS

Patent Document
Patent Document 1: Japanese Unexamined Patent Publication No. 2011-174751
Patent Document 2: Japanese Unexamined Patent Publication No. 2008-128711

SUMMARY

In some cases with the above-mentioned structure using linear magnetic bodies, too many magnetic fluxes to be measured are concentrated toward the SVGMR element, so that the number of fluxes is close to or exceeds the upper limit of the measurement, and thus, measurement accuracy is decreased.

The present disclosure has been made in view of the above drawbacks, and one of the objects of the present disclosure is to provide a magnetic sensor device capable of improving measurement accuracy, while magnetic fluxes to be measured can be prevented from concentrating to a magnetic sensing element.

The structure disclosed in Patent Document 1 is intended to reduce the influence from the external magnetic field. In an example of Patent Document 1, a conductor through which a current to be detected flows is wound around an inward projection, to thereby concentrate magnetic fluxes by the current to the magnetic detection element.

In order to solve the problems of the conventional examples, the present disclosure discloses a magnetic sensor device comprising a thin film first magnetic body provided with a magnetic path convergence/divergence section arranged on a predetermined axis, and at least a pair of wing-shaped sections extending from the magnetic path convergence/divergence section toward the opposite sides of said axis, a thin film second magnetic body provided with a magnetic path convergence/divergence section arranged on said predetermined axis to be spaced from the magnetic path convergence/divergence section of the first magnetic body, at least a pair of wing-shaped sections extending from this magnetic path convergence divergence toward the opposite sides of said axis, a first coil wound around the first magnetic body, a second coil wound around the second magnetic body, and a magnetoresistance effect element arranged between the magnetic path convergence/divergence section of the first magnetic body and the of the second magnetic body, wherein the first coil applies a magnetic field to a magnetic path of the first magnetic body, the magnetic path converging/diverging from/to the at least a pair of wing-shaped sections of the first magnetic body to/from the magnetic path convergence/divergence section the second coil applies a magnetic field to a magnetic path of the second magnetic body, the magnetic path diverging/converging from/to the magnetic path convergence/divergence section to/from the at least a pair of wing-shaped sections of the first magnetic body, and a magnetic field is applied to the magnetoresistance effect element along the converged magnetic path.

According to the present disclosure, magnetic fluxes to be measured can be prevented from concentrated to a magnetic sensing element, and the measurement accuracy can be increased.

EMBODIMENT

Figure 1:
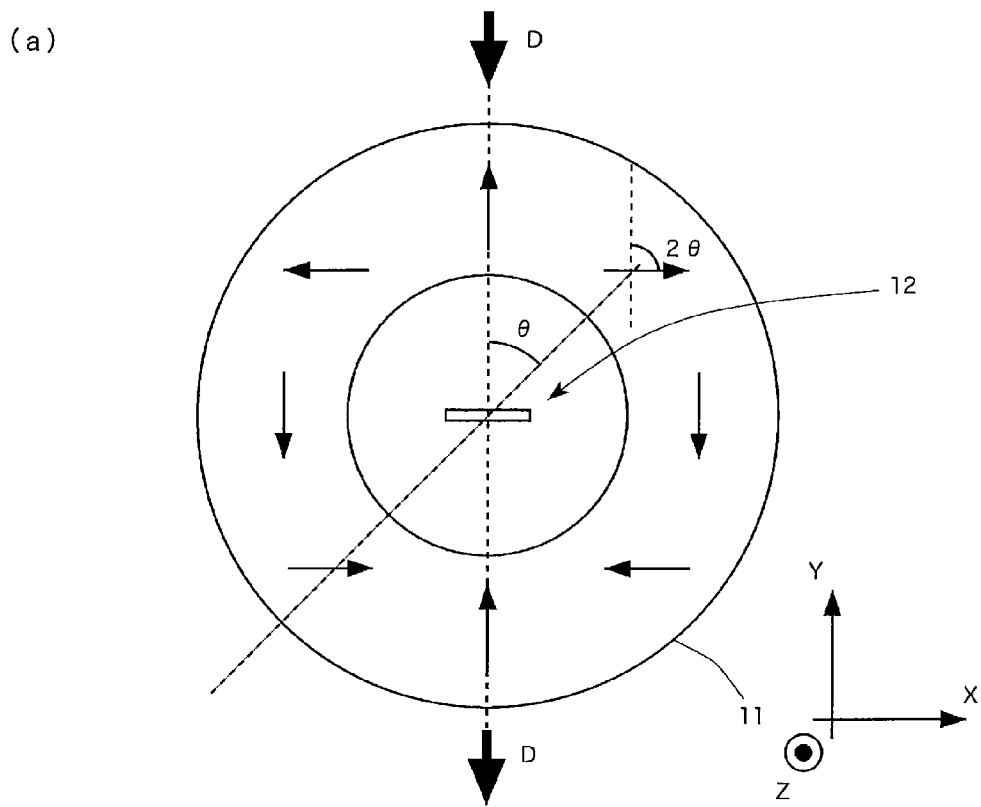
FIG. 1 is an explanatory view showing a schematic example of a magnetic sensor device according to an embodiment of the present disclosure.
Figure 1:
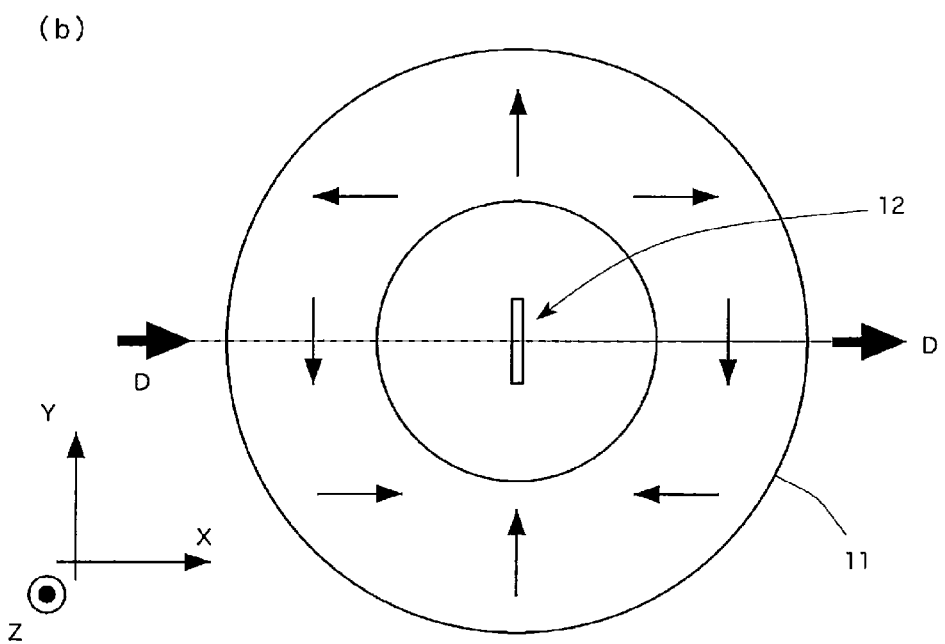

An embodiment of the present disclosure will be explained with reference to the drawings. FIG. 1 shows an example of a motivational structure for creating a magnetic sensor device 1 according to an embodiment of the present disclosure. As shown in FIGS. 1 (a) and (b), conceptually, this structure comprises an annular magnetic body 11 formed in a plane, and a magnetoresistance effect element 12 arranged at the center thereof. The magnetic body 11 is magnetized in a way so that when two positions are located in circumferential directions from the center different by an angle of θ, magnetization directions at these positions are different by 2θ (in FIG. 1, the magnetization directions are shown by arrows).

In the structure of FIG. 1 (a), the magnetoresistance effect element 12 is an SVGMR (Spin Valve Giant Magnetoresistive) element in which the width direction thereof (the direction perpendicular to the longitudinal direction of the magnetoresistance effect element 12 itself, when a plurality of magnetoresistance effect elements are connected in series and zigzag (meander) form, the direction perpendicular to the longitudinal direction of each magnetoresistance effect element) is a magnetic sensing direction.

The magnetoresistance effect element 12 according to the example shown in FIG. 1 (a) comprises a fixed layer having a magnetization direction fixed to the width direction thereof (the layer having a magnetization direction which is not changed by the external magnetic field).

In the structure shown in FIG. 1 (a), the magnetic body 11 and the magnetoresistance effect element 12 are arranged so that the width direction of the magnetoresistance effect element 12 matches with the direction D (negative Y-axis direction in FIG. 1 (a)) of the magnetic field to be measured. In the magnetic body 11, the X-axis direction size (namely, lateral direction size) and the Y-axis direction size (namely, longitudinal direction size) are the same. The magnetic body 11 shown in FIG. 1 (a) has an annular shape having an aspect ratio of 1, and the outer peripheral shape of the magnetic body 11 is an exact circle.

In another motivated structure, as exemplified in FIG. 1 (b), the magnetic body 11 and the magnetoresistance effect element 12 may be arranged so that the direction D (X-axis direction) of the magnetic field to be measured and the width direction of the magnetoresistance effect element 12 become perpendicular to the direction of the magnetic flux applied from the magnetic body 11 to the magnetoresistance effect element 12 arranged at the center thereof (namely, matches with the X-axis direction). In this case, the magnetic body 11 and the magnetoresistance effect element 12 are arranged so that the width direction of the magnetoresistance effect element 12 becomes perpendicular to the direction of the magnetic flux applied form the magnetic body 11 to the magnetoresistance effect element 12. The magnetic sensor device 1 exemplified in FIG. 1 (a) has a structure for an embodiment suitable to be used as a feedback type current sensor. The magnetic sensor device 1 exemplified in FIG. 1 (b) has a structure for an embodiment suitable to be used as a magnetic proportion type current sensor.

Figure 2:
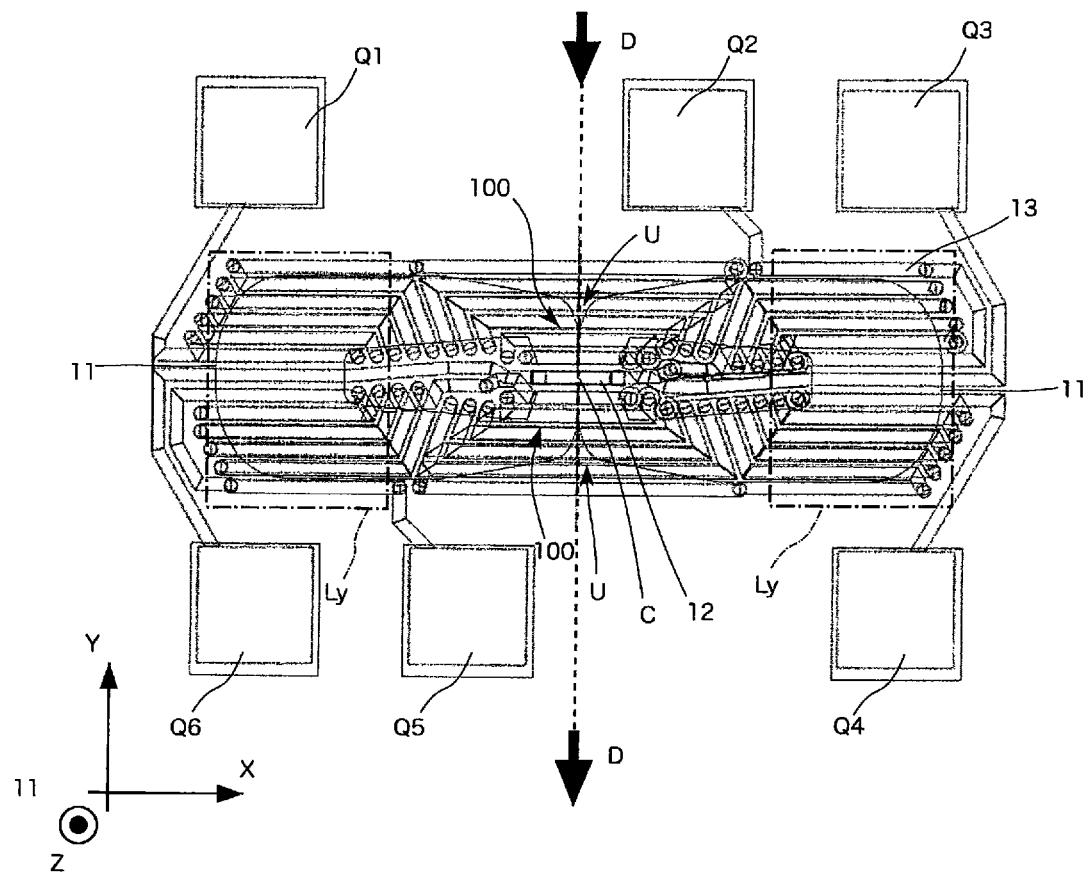
FIG. 2 is a plan view showing a structural example of a magnetic sensor device according to an embodiment of the present disclosure.

FIG. 2 shows an example of a magnetic sensor device 1 according to an embodiment of the present disclosure (hereinbelow, then this example should be distinguished from other examples, this example is referred as Type 1). The magnetic sensor device 1 according to this example is provided with an annular magnetic body 11 having a longitudinal size different from the lateral size, a magnetoresistance effect element 12 arranged near the center C of the magnetic body 11, and layers respectively stacked on the magnetic body 11 to hold the magnetic body 11 therebetween, the layers respectively containing a lower pattern 13a of a coil 13 and an upper pattern 13b of the coil 13. This magnetic sensor device 1 is capable of measuring the magnetic field externally applied in the D direction (negative Y-axis direction) in FIG. 2. In the magnetic body 11, the X-axis direction size (namely, the lateral size) is larger than the Y-axis direction size (namely, longitudinal size). The magnetic body 11 in FIG. 2 has an annular shape having a longitudinal size different from the lateral size. The outer peripheral shape of the magnetic body 11 is not an exact circle.

Here, the magnetic body 11, and the lower pattern 13a and the upper pattern 13b of the coil 13 are overlapped, and partly hidden in the plan view, and thus, actually, are not easily visible. However, in FIG. 2 showing a plan view of the magnetic sensor device 1, the magnetic body 11, the magnetoresistance effect element 12, and the coil 13 are shown with transparency.

The magnetic body 11 is made of, for example, an iron-nickel alloy (permalloy), and has a thickness of 1 μm, saturation magnetic flux density Bs of 1.45 T, and initial magnetic permeability μi of 2000, in an example of the present embodiment. Further, this magnetic body 11 has a narrowed portion 100 narrowed toward the magnetoresistance effect element 12 at a position where the line extending in the minor-axis direction through the center C (the center both in the width direction and the longitudinal direction) of the magnetic body 11 intersects the magnetic body 11. Thereby, both the outer periphery and the inner periphery of the magnetic body 11 have substantially dumbbell shapes. The narrowed portion 100 is a portion of the magnetic body where the width of the magnetic body is reduced in the x-axis direction. The dumbbell shape refers to the shape formed by connecting two pieces of C-shape arranged by opposing the openings thereof, or the shape formed by connecting two pieces of 3-shape opposing to each other so that the upper portion of the upper arc of "3" is connected to the lower portion of the lower arc of the other "3". Here, the inner periphery of the magnetic body 11 is formed to be symmetry with respect to the line passing though the center C and parallel with Y-axis, and other than the narrowed portion 100, the width w in the Y-axis direction of the inner periphery is gradually reduced as the distance from the center increases. Portions Ly of the magnetic body 11 which extend substantially parallel to the Y-axis are formed to have a wider width than other portions. Thereby, the magnetic body 11 cannot be easily saturated when a large external magnetic field is applied. For example, when the width of Ly is 100 μm, the external magnetic field can be applied about 3182 A/m (40 Oe), when 150 μm, about 3422 A/m (43 Oe) can be applied, and when 200 μm, about 3740 A/m (47 Oe) can be applied.

The narrowed portion 100 of the magnetic body 11 is tapered so that the width is gradually reduced toward the magnetoresistance effect element 12 (namely, the closer to the magnetoresistance effect element 12, the narrower the width). Since the width in the X-axis direction is narrowed, the side of the narrowed portion is inclined relative to the Y-axis, and thus, tapered. Further, a notch U (a V-shaped recesses formed at positions where the directions of the magnetic fields are symmetric on the opposite sides in the X-axis direction with respect to the Y-axis) may be formed on the outer peripheral side of the narrowed portion 100 (a position on the outer periphery where the line passing through the center and extending in the minor-axis direction intersects), the notch being notched toward the center C, namely, toward the magnetoresistance effect element 12. A coil 13 is wound around this magnetic body 11 to form magnetic fields so that the directions of the magnetic fields are distributed to have a 360-degree rotation over the half of the periphery of the magnetic body 11.

According to an embodiment of the present disclosure, the magnetic body 11 is formed so that the width of the magnetic body 11 at the position where the line passing through the center C and extending in the minor-axis direction intersects is narrower than the width of the magnetic body 11 at the position where the line passing through the center C and extending in the major-axis direction intersects.

The magnetoresistance effect element 12 is, for example, a spin-valve giant magnetoresistance effect element (SVGMR element), having a fixed layer magnetized in the width direction (the direction perpendicular to the longitudinal direction), and presenting a resistance value corresponding to the intensity of the magnetic field in the width direction. According an example of the present embodiment, the magnetoresistance effect element 12 is arranged so that the width direction thereof becomes parallel to the Y-axis. In the spin-valve giant magnetoresistance effect element the magnetization direction of the fixed layer is preferably self-pinned. The self-pinned fixed layer may have a structure formed by staking a ferromagnetic layer, an Ru layer, and a ferromagnetic layer, to thereby have antiferromagnetic connection between the ferromagnetic layers with the Ru layer therebetween.

The coil 13 comprises a lower pattern 13a arranged on the surface stacked on the lower side than the surface having the magnetic body 11, and an upper pattern 13b arranged on the surface stacked on the upper side than the surface having the magnetic body 11. The lower pattern 13a is shown in FIG. 3(a), and the upper pattern 13b is shown in FIG. 3(b). In FIGS. 3(a) and (b), circler portions indicate positions of via holes. Via holes are located at corresponding positions on the upper pattern 13b and the lower pattern 13a to electrically connect the corresponding circler portions through the via holes. The lower pattern 13a and the upper pattern 13b are electrically connected by rectangular pads Q1 to Q6. In the explanation below, major-axis direction of the magnetic body 11 is referred to as X-axis (in the Figure, the direction to the right is the positive direction of the X-axis, whereas the direction perpendicular to this direction is referred to as Y-axis (in the Figure, the upward direction is the positive direction of Y-axis).

At the positions where the wire or coil is bent and curved on the XY surface, crosslines connecting the curves or recesses formed by the bending are shown. Using the crosslines, the wire or coil is shown by connecting a plurality of rectangular shaped lines. In this regard, however, the wire or coil may be formed by a single continuous line without any crosslines between the via holes, or between the via hole and the pad.

In addition, the lower pattern 13a and the upper pattern 13b comprise portions which are symmetry with respect to the center point of the annular magnetic body 11.

Figure 3:
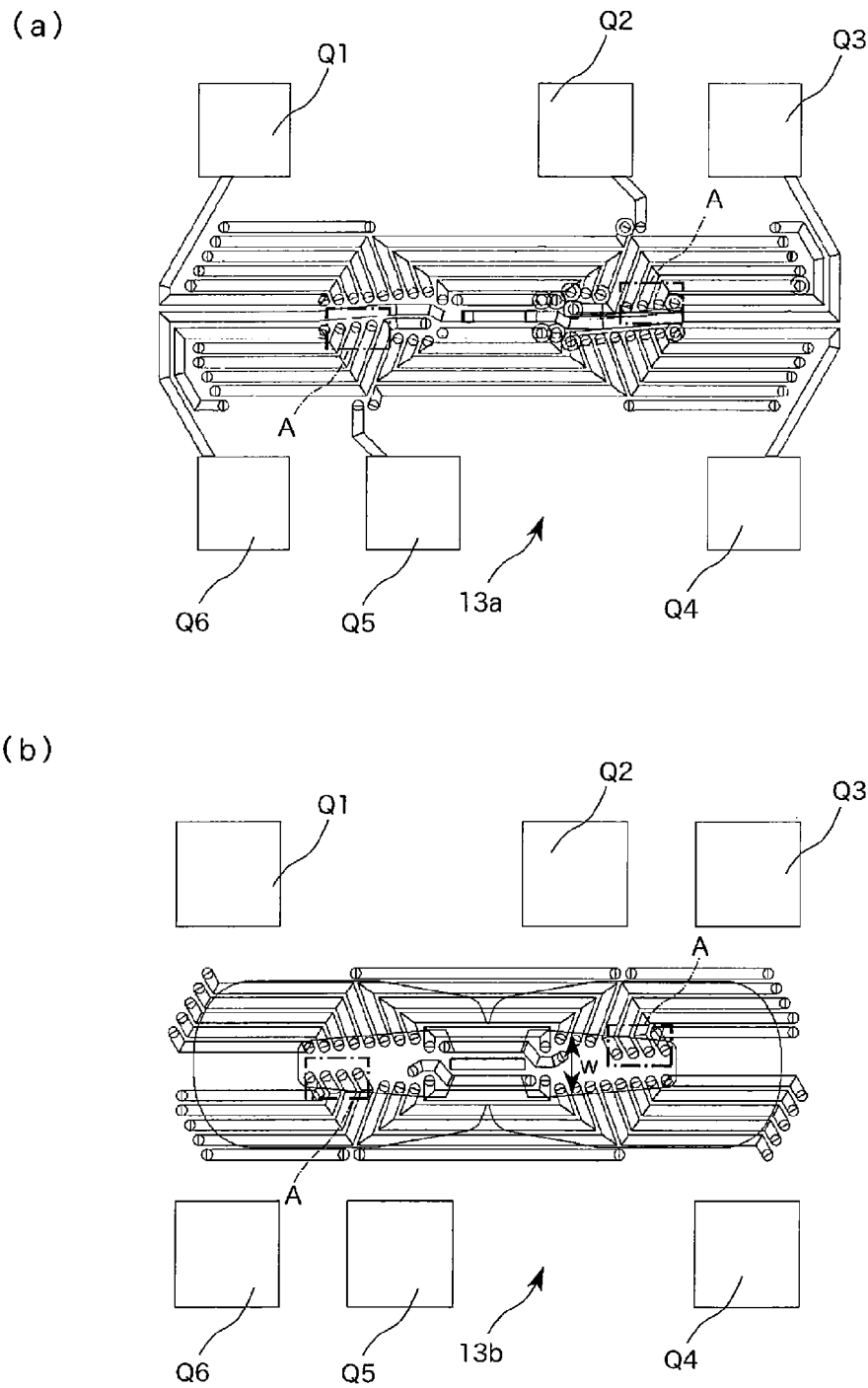
FIG. 3 is an explanatory view showing an example a pattern on each layer of a coil of a magnetic sensor device according to an embodiment of the present disclosure.
Figure 4:
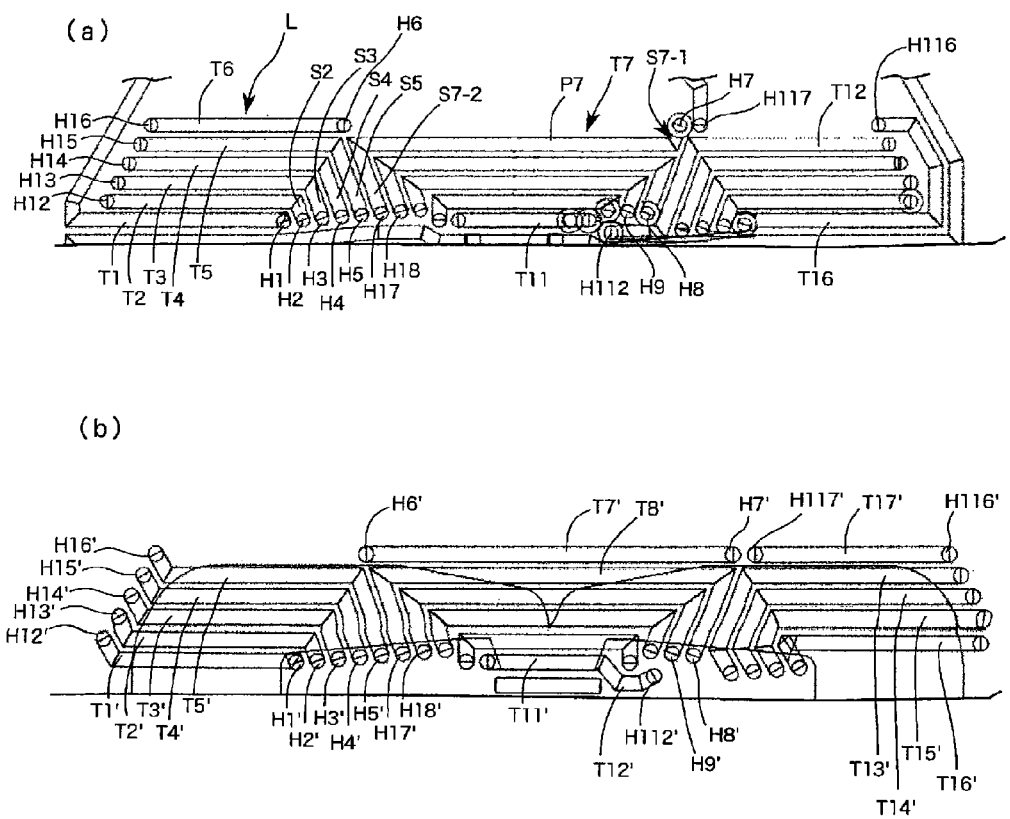
FIG. 4 is an explanatory view showing an example of wiring of a coil of a magnetic sensor device according to an embodiment of the present disclosure.

FIG. 4 (a) shows a portion of the lower pattern 13a shown in FIG. 3 (a), which is a portion on the positive direction side of Y-axis from the line parallel to the major-axis of the magnetic body 11 (line corresponding to the axis of symmetry). FIG. 4 (b) shows a portion of the upper pattern 13b shown in FIG. 3 (b), which is a portion on the positive direction side of Y-axis from the line parallel to the major-axis of the magnetic body 11 (line corresponding to the axis of symmetry). At least a portion of the winding wire pattern is not liner, and comprises a parallel portion L parallel to X-axis and a portion obliquely intersecting the parallel portion L (a portion intersecting the magnetic body in the peripheral direction so as to be inclined at an angle within a predetermined angle range, hereinafter referred to as an inclined portion) S. Namely, this pattern is bent in mid-course.

The winding wire T1 of the lower pattern 13a in FIG. 4 (a) is connected from the pad Q1 through the via hole H1-H1 to the winding wire T1' of the upper pattern 13b shown in FIG. 4 (b). The wound wire T1' of the upper pattern 13b is connected through the via hole H12'-H12 to the winding wire T2 of the lower pattern 13a.

The winding wire T2 includes an inclined portion S2, and is connected through the via hole H2-H2' to the winding wire T2' of the lower pattern 13b. This winding wire T2' also includes an inclined portion. Subsequently, winding wires T3, T3', T4 . . . , T5' are would around the magnetic body 11 while the wires are arranged to form the lower pattern 13a and the upper pattern 13b through the corresponding via holes.

Here, the among the winding wires T1, T2 . . . , T5, and among the winding wires T1', T2' . . . , T5', the further the winding wire located to the positive direction of X-axis, the longer the inclined portion S. The inclined angle of the inclined portion S relative to Y-axis is constant, and is, for example, 20 degrees (70 degrees relative to X-axis).

The winding wire T6 is connected through the via hole H6-H6' to the winding wire T7' of the upper pattern 13b. The winding wire T7' is connected through the via hole H7'-H7 to the Z-shaped winding wire T7 of the lower pattern 13a. The winding wire T7 includes two inclined portions S7-1 and S7-2, and a parallel portion P7. The line extending from the inclined portion S7-1 is symmetric to the line extending from the inclined portion S7-2, with respect to Y-axis. The winding wire T7 is connected through the via hole H17-H17' to the Π-shaped winding wire T8' of the upper pattern 13b. Subsequently, winding wires T8, T9', T9 . . . , T11, T12' are would around the magnetic body 11 while the wires are arranged to form the lower pattern 13a and the upper pattern 13b through the corresponding via holes. At least a part (in FIG. 4, T8, T9, T8', T9') of the winding wires T8, T9 . . . , T11, and T8', T9', . . . T11', are respectively provided with two inclined portions S to have shapes substantially symmetric with respect to Y-axis, except for the edges such as connecting portions.

In the present example, the winding wires T10, T11, T11', T12' are structured so that the portions the wires substantially parallel to X-axis are wound around the narrowed portion of the magnetic body 11. The winding wire T12' is connected through the via hole H112'-H112 to the winding wire T12. The winding wires T12 . . . T16, and T13' . . . T16' substantially have shapes respectively symmetric to the shapes of the winding wires T5, T4 . . . , T1, T5', . . . T2' with respect to Y-axis. The winding wire T16 is connected through the via hole H116-H116' to the winding wire T17', and the winding wire T17' is connected through the via hole H117'-H117 to the pad Q2.

In the example of FIG. 3, the pad Q3 is wired to the lower pattern 13a, and is connected to one of the terminals of the magnetoresistance effect element 12. The pad Q6 is wired to the layer same as the layer of the lower pattern 13a, and is connected to the other terminal of the magnetoresistance effect element 12.

Figure 5:
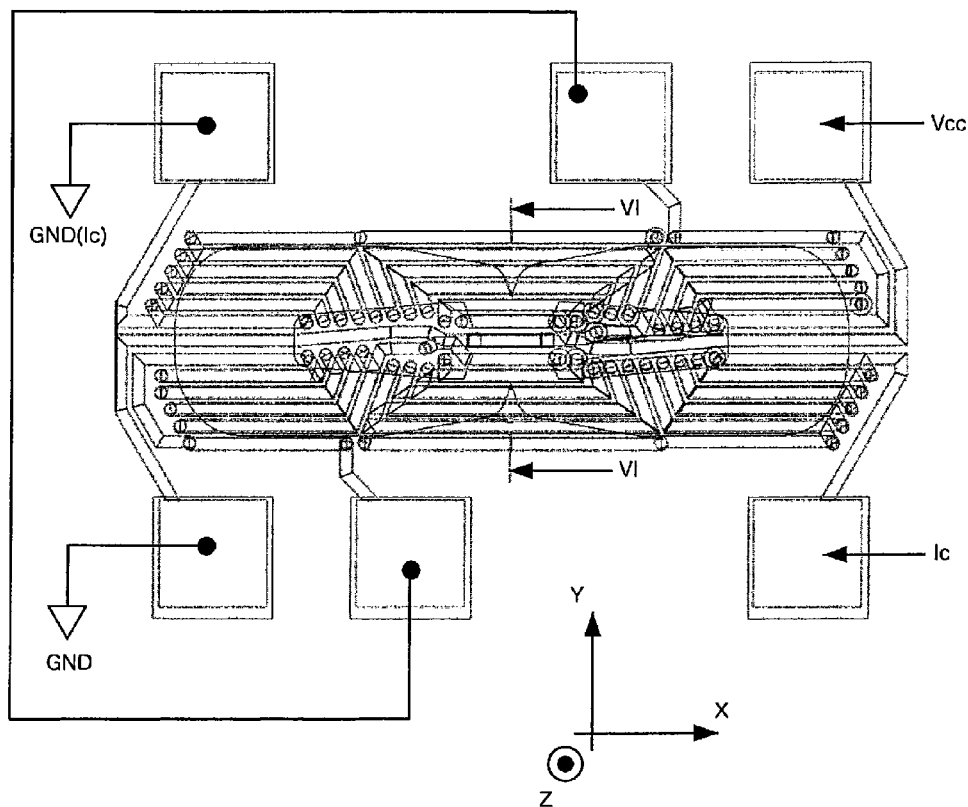
FIG. 5 is an explanatory view showing an example of a wired magnetic sensor device according to an embodiment of the present disclosure.

According to an example of the present embodiment, as exemplified in FIG. 5, the coil current Ic is applied to the pad Q4. The pad Q5 is connected to the pad Q2. Further, the pad Q1 is connected to the common terminal (GND) of the coil current Ic. The supply voltage Vcc of the magnetoresistance effect element 12 is applied to the pad Q3. The pad Q6 defines an output terminal Vout (an output terminal of a voltage signal representing a potential Vout from the common terminal (GND) of the magnetoresistance effect element 12). The coil current Ic applied to the pad Q4 flows through the coil 13, and thereby, the coil 13 magnetizes the magnetic body 11 so that at positions deviated from each other at an angle of θ from the center, the magnetization directions are different by 2θ. In the present example, the magnetic body 11 is magnetized in the direction same as the narrowing down direction of the narrowed portion 100 (namely, in the direction parallel to the width direction of the magnetoresistance effect element 12).

Figure 6:
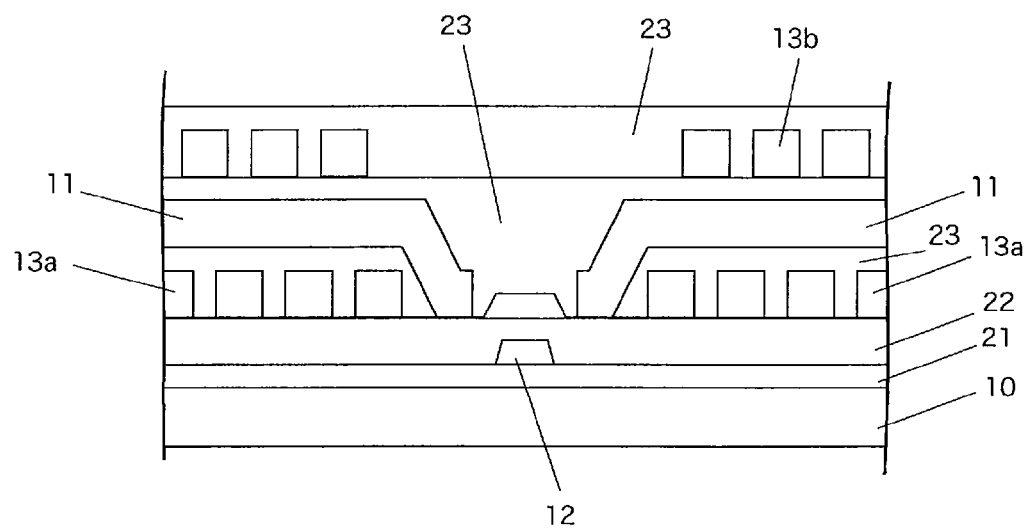
FIG. 6 is a cross-sectional view showing an example of a partial sectional view of a magnetic sensor device according to an embodiment of the present disclosure.
Figure 7:
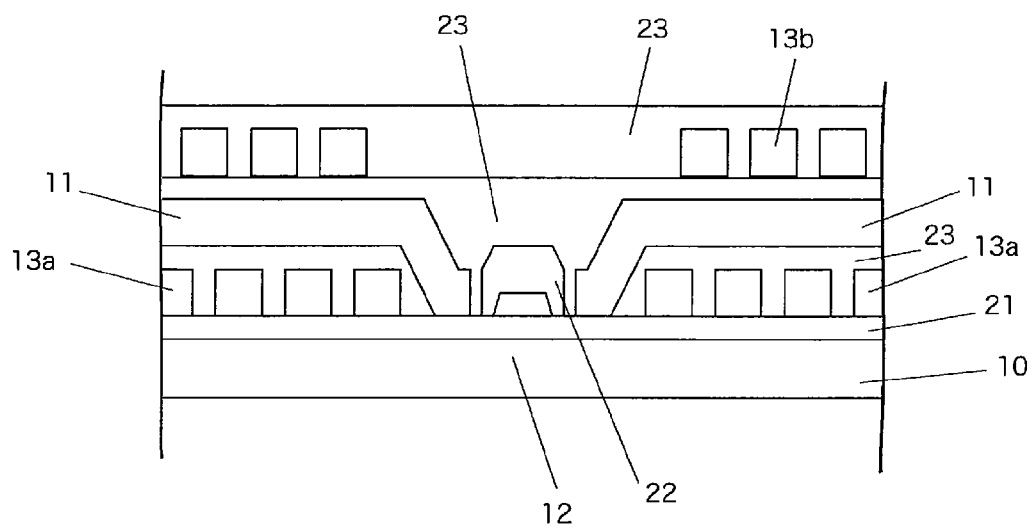
FIG. 7 is a cross-sectional view showing another example of a partial sectional view of a magnetic sensor device according to an embodiment of the present disclosure.
Figure 8:
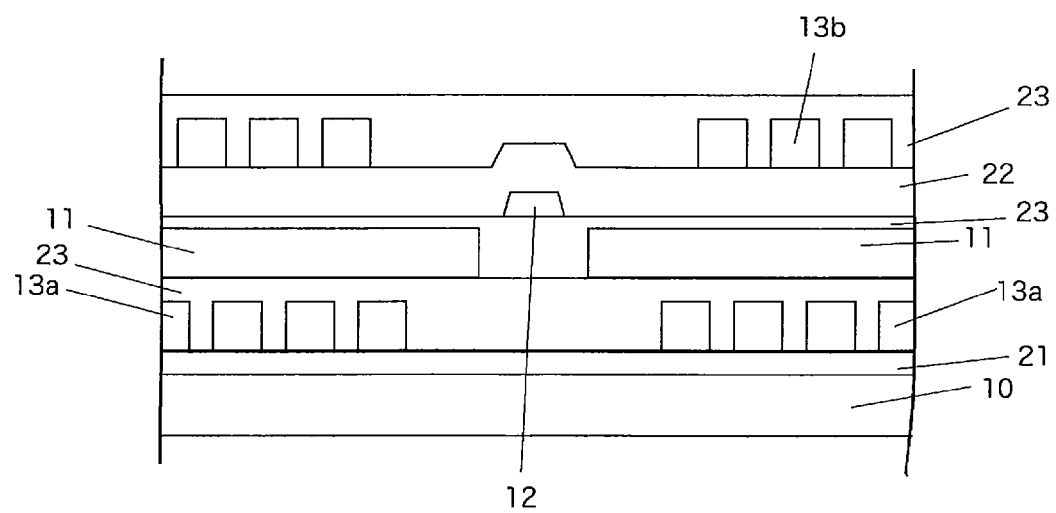
FIG. 8 is a cross-sectional view showing still another example of a partial sectional view of a magnetic sensor device according to an embodiment of the present disclosure.

FIG. 6 is an example of a cross-sectional view schematically showing a part of the magnetic sensor device 1 exemplified in FIG. 3, broken along a line passing through the center of the magnetic body 11 (the line along VI-VI in FIG. 5), the view showing the part near the center (the part near the magnetoresistance effect element 12) (the same is true for FIG. 7 and FIG. 8). For easy understanding, FIG. 6 shows the outline of the arrangement of the coil 13, etc., by reducing the number of windings, etc. The magnetic sensor device 1 according to an example of the present embodiment exemplified in FIG. 6, is produced as mentioned below.

Namely, an insulation layer 21 consisting of two layers (SiO$_2$ (substrate side) and Al$_2$O$_3$ (insulation film 22 side)) is formed on a substrate 10, and even numbers of magnetoresistance effect elements 12 (SVGMR element films) each having a width of 10 μm, are formed thereon, by thin film processes. In addition, an insulation film 22 thicker than the film of the magnetoresistance effect element 12 is formed thereon, and further, a magnetic body 11 made of permalloy, etc., and a lower pattern 13a of a coil 13 wound around the magnetic body 11 are formed on the insulation film 22, and a resin 23 (insulation body) is provided for sealing. Then, via holes H are formed on the resin 23, and conductors are formed on the lower pattern 13a, so that the positions of the conductors correspond to the positions of the via holes H. Next, an upper pattern 13b of the coil 13 to be connected to these conductors is formed, and the resin 23 (insulation body) is further provided for sealing. A Pad Q which is to be conductively connected to the coil, is exposed from the resin. The magnetic body 11 is arranged to have a space of about 2 μm from each of the opposite sides in the magnetic flux direction of the magnetoresistance effect element 12. In the present example, the magnetoresistance effect element 12 is arranged on the substrate 10 side (lower layer side) from the magnetic body 11, and the portions of the magnetic body 11 near the center C may be extended toward the lower layer side.

FIG. 7 shows another example. In the example of FIG. 7, an insulation layer 21 consisting of two layers (SiO$_2$ (substrate side) and Al$_2$O$_3$ (insulation film 22 side)) is formed on a substrate 10, and a magnetoresistance effect element 12, a magnetic body 11 made of permalloy, and aluminum winding wire of a coil 13 wound around the magnetic body 11 (a lower pattern 13a) are formed on the insulation layer 21. The magnetoresistance effect element 12 is formed on the same layer as the magnetic body 11, and then, the magnetoresistance effect 12 is isolated by an insulation layer 22. Thereafter, the entirety is sealed by a resin 23. Then, via holes H are formed on predetermined portions of the resin 23, and conductors are connected to corresponding portions of the winding wire of the coil 13 (lower pattern 13a). Next, a winding wire of the coil (an upper pattern 13b) to be connected to these conductors is formed, and the resin 23 (insulation body) is further provided for sealing.

FIG. 8 shows still another example. In the example of FIG. 8, an insulation layer 21 consisting of two layers (SiO$_2$ (substrate side) and Al$_2$O$_3$ (insulation film 22 side)) is formed on a substrate 10, and a magnetic body 11 made of permalloy, and aluminum winding wire of a coil 13 wound around the magnetic body 11 (a lower pattern 13a) are formed on the insulation layer 21, and then, a resin 23 is provided for sealing. Then, a magnetoresistance effect element 12 is formed by thin film processes, and an insulation layer 22 is formed. Via holes H are formed at predetermined positions of the insulation layer 22, and conductors are connected to corresponding positions on the winding wire of the coil 13 (lower pattern 13a). Next, the remaining portions of the winding wire (upper patter 13b) connected to the conductors are formed, and a resin 23 is provided for sealing. In this case, the magnetoresistance effect element 12 is located on the upper layer (on the layer opposite to the substrate 10 side) than the magnetic body 11

In any of the examples shown in FIG. 6 to FIG. 8, the magnetoresistance effect element 12 does not have to be arranged on the same face as the magnetic body 11, as exemplified in FIG. 6 and FIG. 8. In these examples, the insulation layer 21 does not have to be a two-layered form, but can be a single film of SiO$_2$, Al$_2$O$_3$, silicon nitride, etc., or a multilayered film formed by laminating these films.

A magnetic sensor circuit according an example of the present embodiment is what is referred to as a magnetic balance circuit, and can be used, for example, as a current sensor. As exemplified in FIG. 9, in the magnetic sensor circuit, one end of the magnetoresistance effect element 12 is connected to receive a DC bias supply voltage Vcc, and is also connected to the negative (−) terminal of a comparator 14. The other end of the magnetoresistance effect element 12 is connected to a common terminal (GND). The positive (+) terminal of the comparator 14 is connected to a common terminal (GND) through a reference supply 15. The output potential of the reference supply 15 defines a potential of the magnetoresistance effect element 12 where no magnetic field is present.

The output of the comparator 14 is connected to an end of the coil 13 (pad Q4) through a waveform shaping unit 41 and a low-pass filter (LPF) 42, and is also connected to an output terminal OUT. Further, the other end of the coil 13 (pad Q6) is connected to a common terminal (GND) through a fixed resistor.

A magnetic sensor device 1 according to the example of the present embodiment receives a voltage signal output from the magnetoresistance effect element 12 through the comparator 14, the waveform shaping unit 41, and the LPF 42. The output received through the LPF 42 is a voltage signal proportional to the difference between the potential of the reference supply and the potential of the voltage signal output from the magnetoresistance effect element 12.

Here, if the magnetic sensor device 1 is arranged near a conductor (for example, bus bar) through which a current to be measured flows, the resistance value of the magnetoresistance effect element 12 is varied due to the induction magnetic field caused by the current to be measured. Thus, the output potential is offset from the potential when no magnetic field is present (as mentioned above, the potential of the reference supply has been set equal to this potential), the output received through the comparator 14, the waveform shaping unit 41, and the LPF 42 is a voltage signal having a value corresponding to the offset value of the potential. This voltage signal indicates the intensity of the induction magnetic field caused by the current to be measured (current flowing through bus bar).

This voltage signal is supplied to one end of the coil 13 to flow a current through the coil 13, and thereby, a magnetic field (cancel magnetic field) is generated. The magnetic flux caused by this cancel magnetic field and the current to be measured caused by the induction magnetic field are applied through the magnetic body 11 to the magnetoresistance effect element 12. When the magnetic flux passing through the magnetoresistance effect element 12 becomes zero (when the output voltage of the magnetoresistance effect element 12 becomes equal to the reference potential 15), a voltage signal V in proportion to the value of the current supplied to the coil 13 is extracted (OUT). This voltage signal V becomes an output signal proportional to the value of the current to be measured (in the above example, the current flowing through the bus bar).

In this case, a magnetic shield may be provided between the bus bar and magnetic sensor device 1 according to the present embodiment so as to selectively apply the magnetic field caused by the current within the bus bar to the magnetic sensor device 1.

The magnetic sensor device 1 according to the present embodiment may comprise a plurality of magnetic sensor devices 1 connected in series. In this case, as exemplified in FIG. 10, the magnetic sensor devices 1 are arranged parallel to the magnetic field to be measured. The pad Q1' of one magnetic sensor device 1a is electrically connected to the pad Q4 of the other magnetic sensor device 1b, and the pad Q6' of the one magnetic sensor device 1a is electrically connected to the pad Q3 of the other magnetic sensor device 1b. In this example, the potential at the pad Q6' of the one magnetic sensor device 1a, or the potential at the pad Q3 of the other magnetic sensor device 1b defines an output potential Vout from the common potential of the detection output mentioned below.

Further, the pad Q1 of the other magnetic sensor device 1b is connected to the common terminal (GND) of the coil current Ic, and the pad Q6 of the magnetic sensor device 1b defines a common potential of the detection output. With this structure, operation with a smaller excitation current is possible compared to the case when a bridge circuit is used, and thus, power consumption required for operation can be reduced.

In the above examples, the pad Q2 and the pad Q5 (as well as the pad Q2' and the pad Q5') are electrically connected by external conductive wires. However, as exemplified in FIG. 11, a wire Q may be wired on the same layer as the lower pattern 13a or the upper pattern 13b of the coil 13, to electrically connect portions of the coil 13 corresponding to the pads Q2, Q5 (and Q2', Q5').

Figure 11:
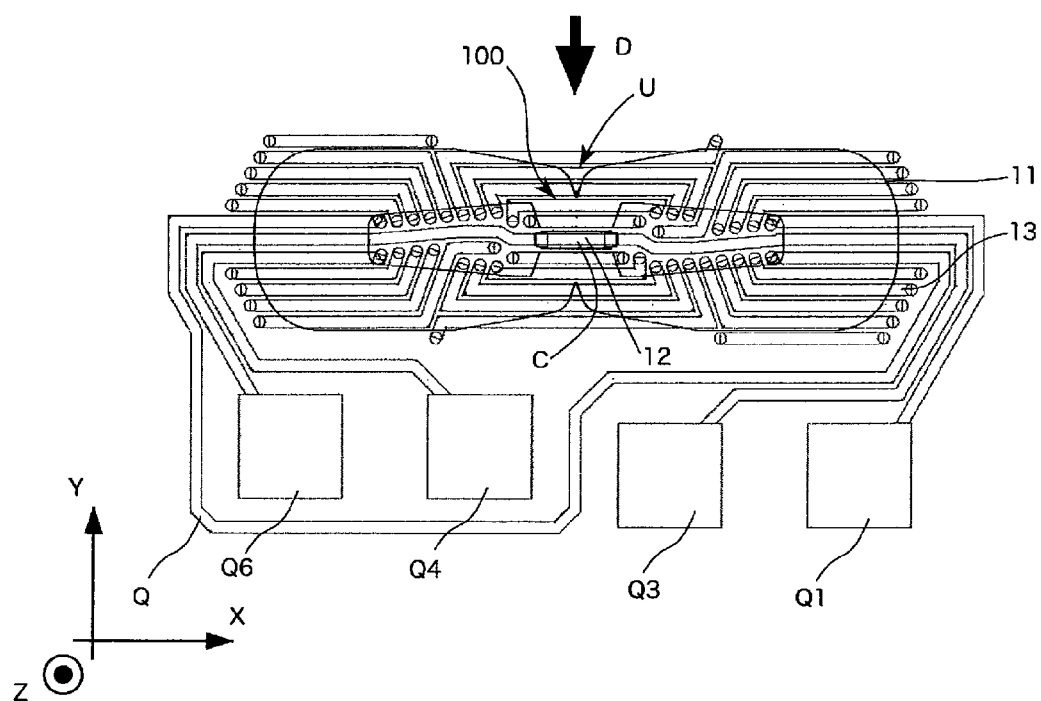
FIG. 11 is a plan view showing another structural example of a magnetic sensor device according to an embodiment of the present disclosure.

Thereby, as exemplified in FIG. 11, the pads Q1, Q3, Q4, Q6 may be formed on one side of the magnetic sensor device 1 with respect to X-axis. When a plurality of magnetic sensor devices 1 are connected in series, the magnetic sensor devices 1 may be arranged in the Y-axis direction as exemplified in FIG. 12.

Figure 10:
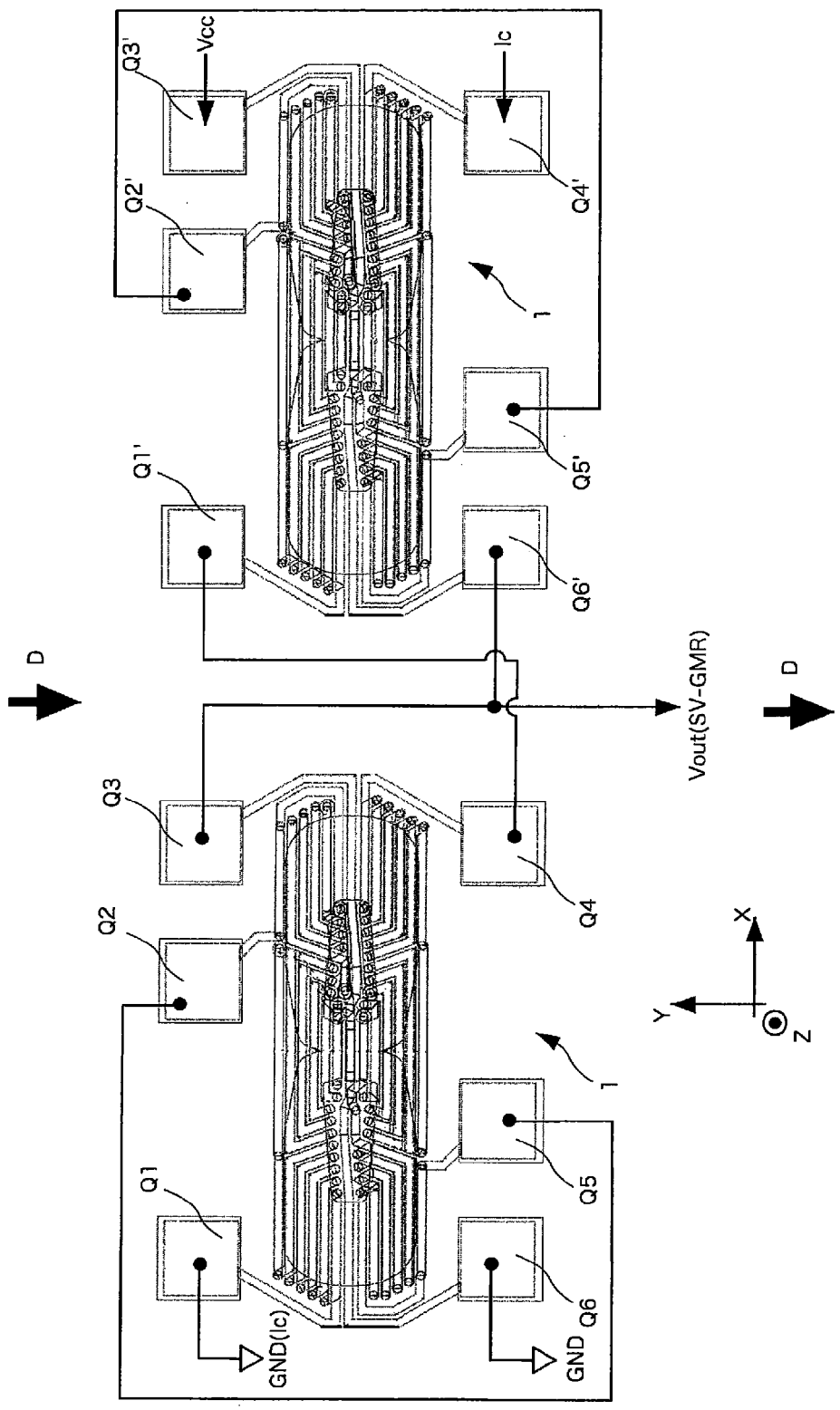
FIG. 10 is an explanatory view showing an example of connecting magnetic sensor devices according to an embodiment of the present disclosure in series.
Figure 12:
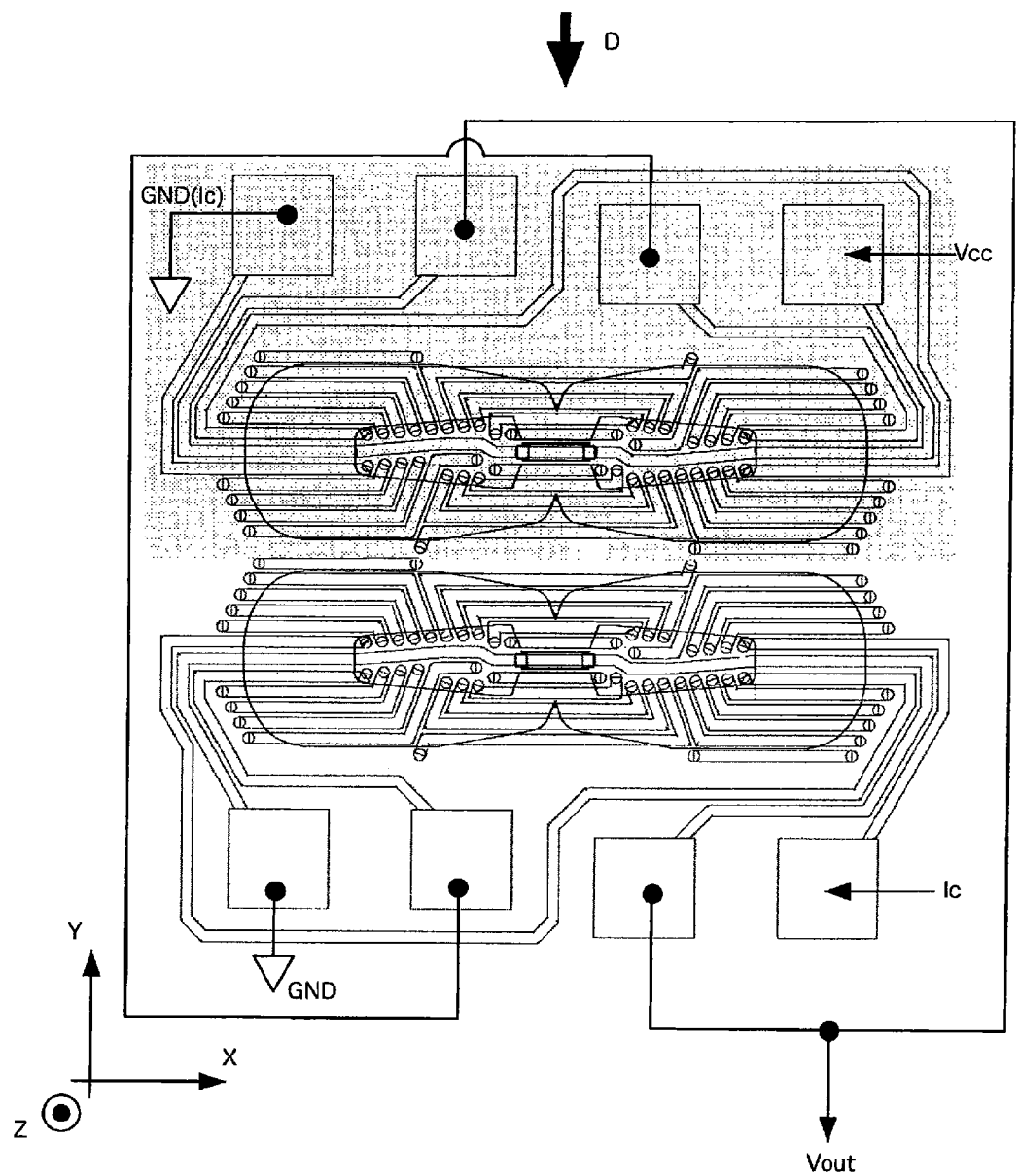
FIG. 12 is an explanatory view showing another example of connecting magnetic sensor devices according to an embodiment of the present disclosure in series.

Here, when two magnetic sensor devices 1 are provided, as exemplified in FIG. 10 or FIG. 12, the magnetization directions of the fixed layers of the respective magnetoresistance effect elements 12 may be set opposite to the direction D of the external magnetic field.

Figure 13:
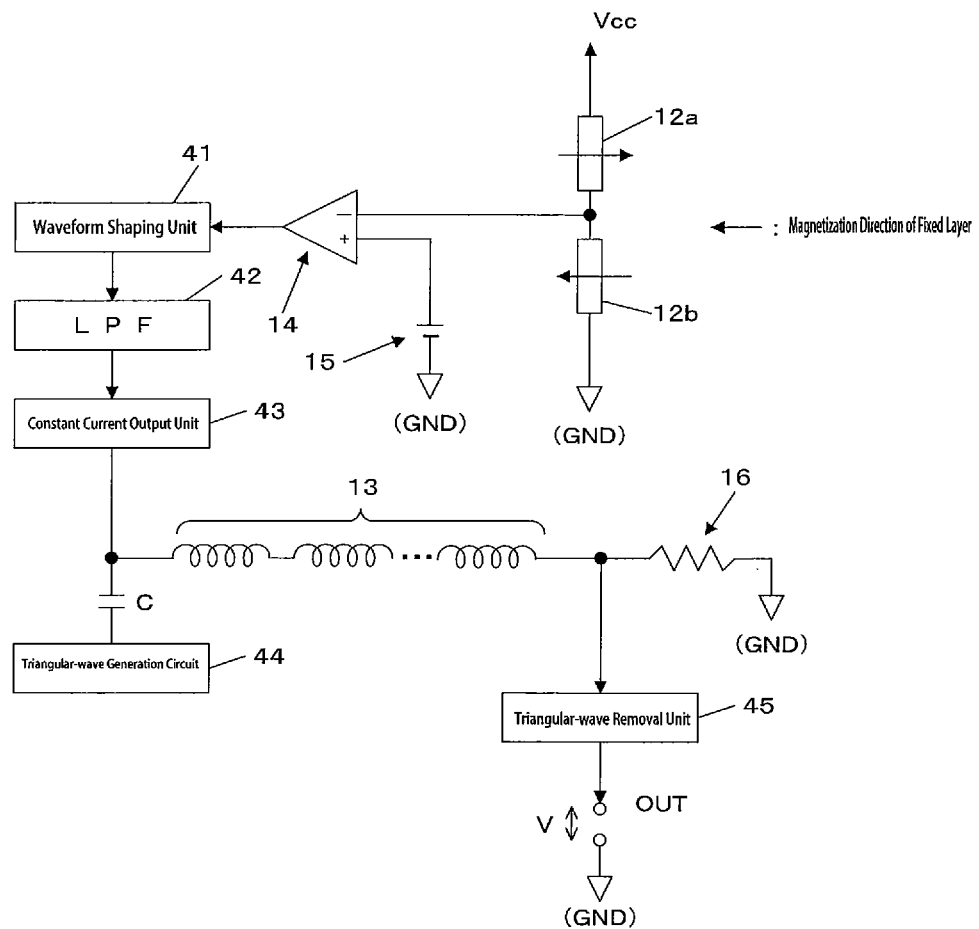
FIG. 13 is a schematic view of a circuit showing another example of a circuit connecting to a magnetic sensor device according to an embodiment of the present disclosure.

This may be a case of a magnetic balance circuit with these magnetic sensor devices 1, which can be used as a current sensor. As exemplified in FIG. 13, one end of the magnetoresistance effect element 12a of the one magnetic sensor device 1a is connected to receive power supply from a DC bias supply Vdd, and the other end of the magnetoresistance effect element 12a is connected to one end of the magnetoresistance effect element 12b of the other magnetic sensor device 1b. Then, the other end of the magnetoresistance effect element 12b is connected to a common terminal (GND). At this time, connection is formed so that the magnetization direction of the fixed layer of the magnetoresistance effect element 12a, which is perpendicular to the direction from one end to the other end of the magnetoresistance effect element 12a, is opposite to the magnetization direction of the fixed layer of the magnetoresistance effect element 12b, which is perpendicular to the direction from one end to the other end of the magnetoresistance effect element 12b. In addition, when the other end of the magnetoresistance effect element 12a, namely, the one end of magnetoresistance effect element 12b, defines a terminal p, the terminal p is connected to the negative (−) terminal of a comparator 14. The positive (+) terminal of the comparator 14 is connected through a reference supply 15 to a common terminal (GND). The output potential of the reference supply 15 is a midpoint potential of magnetoresistance effect elements 12a and 12b at the place where no magnetic field is present.

On the other hand, the coils 13 respectively wound around the magnetic bodies 11 are connected in series, and the output of the comparator 14 is connected to one end of the serially-connected feedback coil 13, through a waveform shaping unit 41, a low-pass filter (LPF) 42, and a constant current output unit (or an inductor) 43. Further, the one end of the coil 13 is also connected to a triangular-wave generation circuit 44 through a coupling capacitance C. In addition, the other end of the coil 13 is connected through a fixed resistor 16 to a common terminal (GND), and is also connected through a triangular-wave removal unit (which may be a low-pass filter) 45, to an output terminal OUT.

In the magnetic sensor device 1 according to the present example, a current which changes to have the shape of a triangular-wave generated by the triangular-wave generation circuit 44, is always supplied to the coil 13. Accordingly, an induction magnetic field by this triangular-wave shaped current is applied to the magnetoresistance effect element 12 through the magnetic body 11. As a midpoint potential output of the magnetoresistance effect element 12, an output which changes in a rectangular-wave shape is obtained with the center at the output potential (reference potential) when no induction magnetic field by the triangular-wave shaped current is applied.

When this midpoint potential output of the magnetoresistance effect element 12 is obtained through the comparator 14, the waveform shaping unit 41, and the LPF 42, a rectangular-wave shaped signal having a duty ratio of substantially 1:1 can be obtained.

Here, if the magnetic sensor device 1 is arranged near the conductor through which the current to be measured flows, resistance values of the magnetoresistance effect elements 12a and 12 bare changed due to the induction magnetic field caused by the current to be measured. Thus, the potential of the terminal P is offset from the midpoint potential (DC offset), and the output potential which changes in the triangular-wave shape, is offset from the reference potential. As a result, the midpoint potential output obtained through the comparator 14, the waveform shaping unit 41, and the LPF 42 changes from the triangular-wave having the duty ratio of 1:1 to that of Tp:Tn(Tp≠Tn), corresponding to the offset amount of the potential. The difference between Tp and Tn indicates the intensity of the induction magnetic field caused by the current to be measured.

The constant current output unit 43 is, for example, an inductor, and outputs a constant value of current in accordance with the midpoint potential output, while making the directions of currents different between the section wherein the obtained midpoint is higher than the reference potential and the section wherein the obtained midpoint potential is lower than the reference potential.

This current is supplied to the coil 13 to cause a magnetic field (cancel magnetic field). The magnetic flux due to the cancel magnetic field, the magnetic flux due to the above-mentioned triangular-wave shaped current, and the induction magnetic field caused by the current to be measured, are applied to the magnetoresistance effect elements 12a and 12b, through the magnetic yoke 11. Then, a voltage signal V, which is proportional to the current value supplied to the coil 13 when the magnetic flux passing through the magnetoresistance effect elements 12a and 12b is zero, is subjected to the removal of triangular waves by the triangular-wave removal unit 45, and is extracted from the opposite ends of the fixed resistor 16 (OUT). Therefore, the voltage signal V becomes an output signal proportional to the value of the current to be measured.

Figure 9:
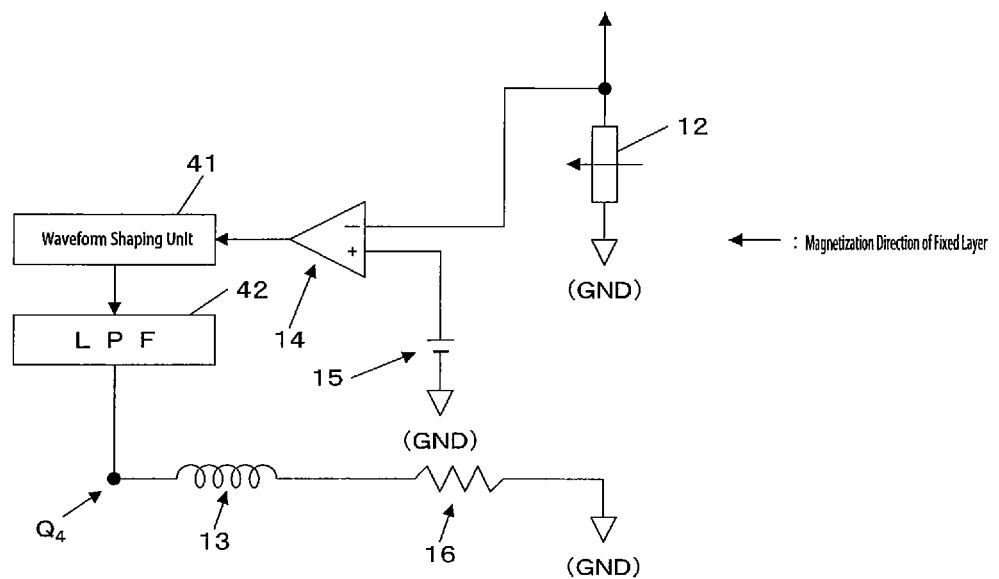
FIG. 9 is a schematic view of a circuit showing an example of a circuit connecting to a magnetic sensor device according to an embodiment of the present disclosure.
Figure 14:
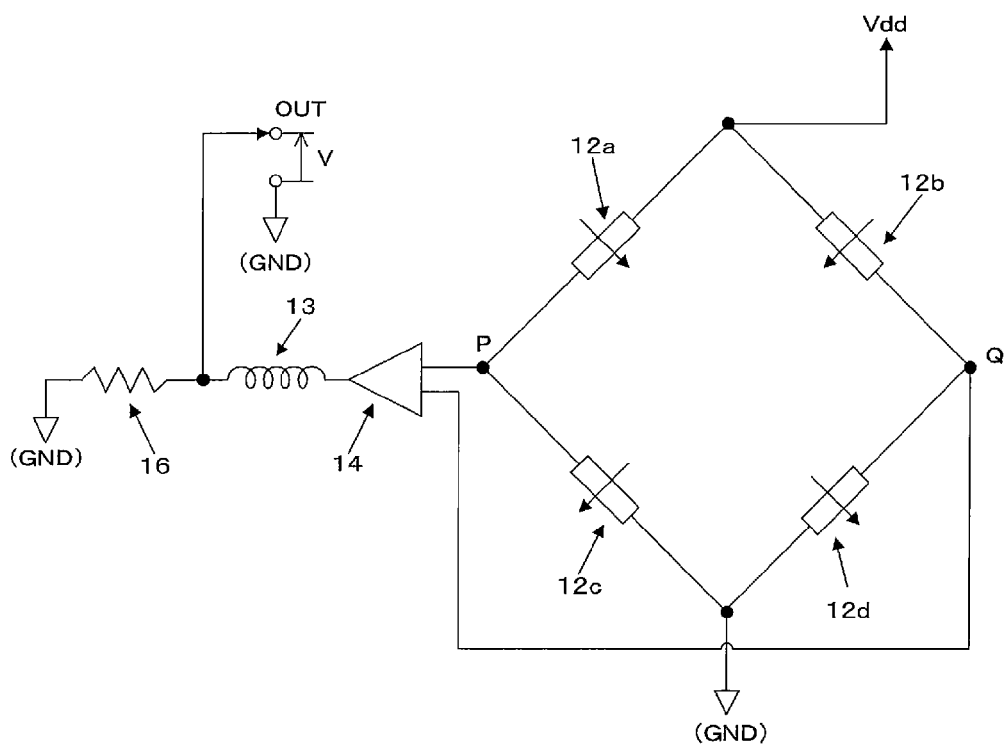
FIG. 14 is a schematic view of a circuit showing still another example of a circuit connecting to a magnetic sensor device according to an embodiment of the present disclosure.

Further, a bridge circuit can be formed using a plurality of magnetic sensor devices 1 according to the present embodiment. In this case, as exemplified in FIG. 14, the magnetoresistance effect elements 12a, 12b, 12c, 12d respectively contained in the magnetic sensor devices 1a, 1b, 1c, 1d are connected to form a bridge. In FIG. 14, the arrow in rectangular representing the magnetoresistance effect element 12, represents the magnetization direction of each fixed layer. The same structures as those in FIG. 9 are assigned with the same numerals, and the explanation therefor will be omitted. Also, in FIG. 14, the coil 13 represents a collection of coils of magnetic sensor devices 1a, 1b, 1c, 1d for applying bias.

Figure 15:
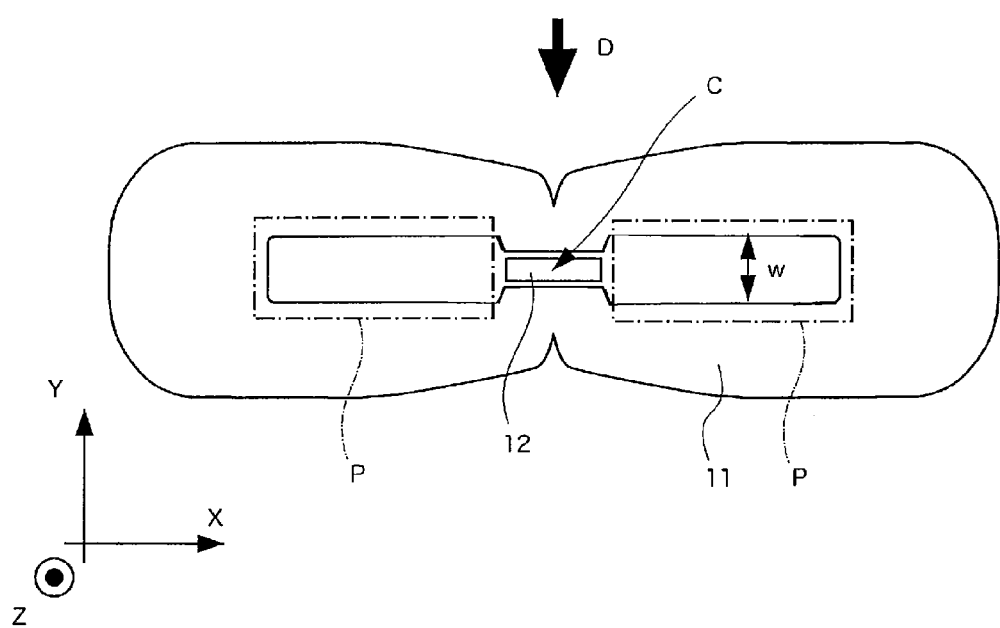
FIG. 15 is an explanatory view showing another example of the shape of a magnetic body used in a magnetic sensor device according to an embodiment of the present disclosure.

Further, in the magnetic sensor device 1 exemplified in FIG. 2, FIG. 10, FIG. 11, and FIG. 12, the inner periphery of the magnetic body 11 is formed so that the longer the distance from the center C, the smaller the width w in the Y-axis direction. However, the shape of the magnetic body 11 according to the present embodiment is not limited thereto. As exemplified in FIG. 15, according to an example of the present embodiment, the magnetic body 11 may be formed to have an inner periphery P with little change in the Y-axis direction width w, except for the narrowed portion 100. Namely, the portion excluding the narrowed portion 100 may be formed to be substantially parallel to the X-axis. In FIG. 15, the coil 13 is omitted for explanation. The Y-axis direction w of the inner periphery is the same as the narrowest width in the example shown in FIG. 2, etc. By narrowing the inner periphery, the magnetic flux density applied from the magnetic body 11 to the magnetoresistance effect element 12 can be increased.

In addition, as shown in FIG. 3(a), (b), etc., there may be different portions between the upper layer pattern 13b and the lower layer pattern 13a of the coil 13 (the portions indicated by A in FIG. 3). However, these portions may be matched (the lower layer pattern 13a may be matched with the upper layer pattern 13b). Thereby, the intensity of the magnetic field applied by the coil 13 can be increased.

Figure 16:
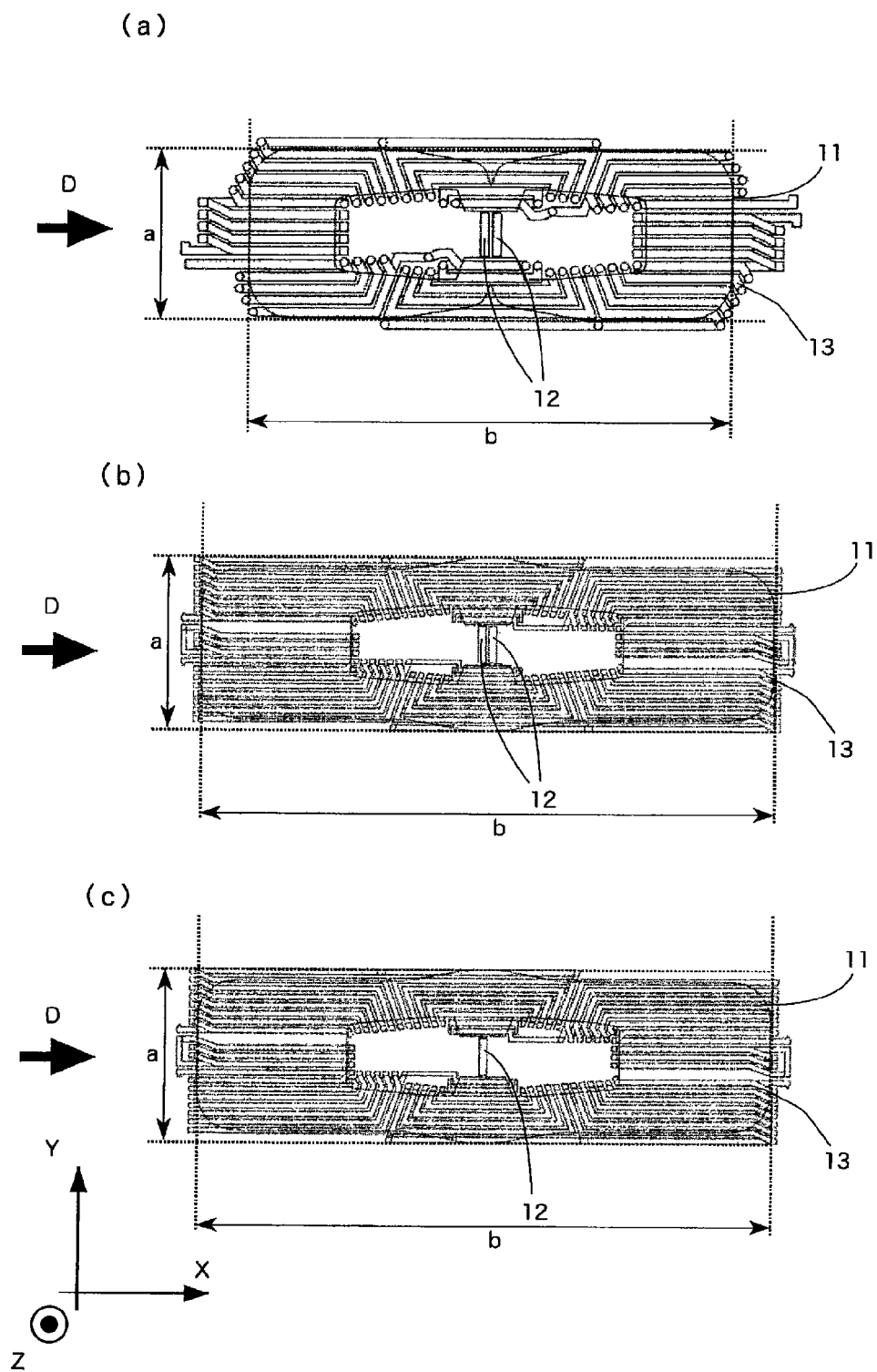
FIG. 16 is a plan view showing still another structural example of a magnetic sensor device according to an embodiment of the present disclosure.
Figure 17:
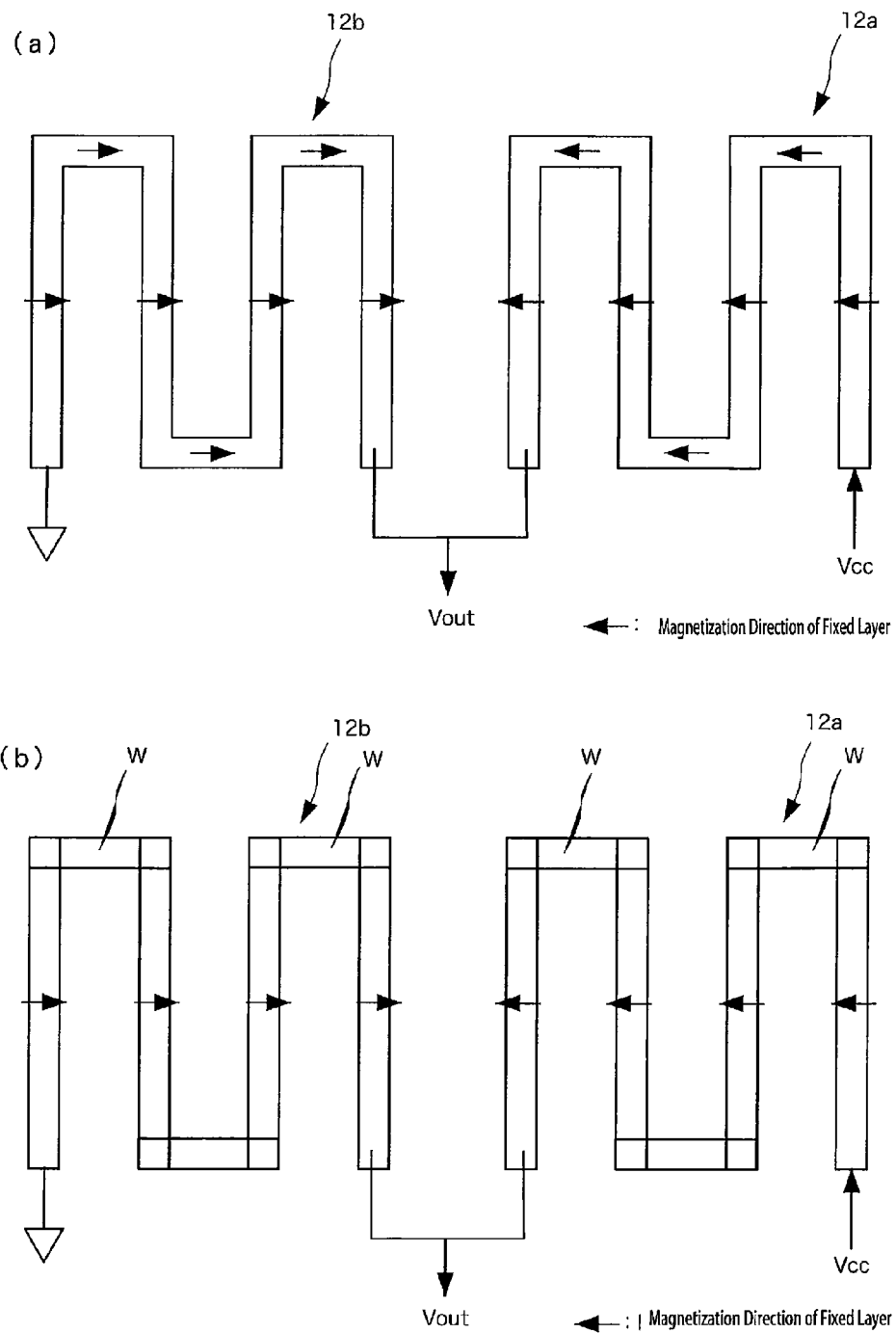
FIG. 17 is an explanatory view showing examples regarding the shape and connection of a magnetoresistance effect element in an example of a magnetic sensor device according to an embodiment of the present disclosure.

According to an example of the present embodiment, as exemplified in FIG. 16(a) to (c), in the magnetic sensor device 1, the magnetoresistance effect element 12 may be arranged so that the width direction thereof is perpendicular to the direction of the magnetic flux to be applied to the magnetoresistance effect element 12 from the magnetic body 11. In the example, the intensity of the external magnetic field applied in the width direction of the magnetoresistance effect element 12 can be measured. As exemplified in FIGS. 16 (a), (b), a plurality of magnetoresistance effect elements 12 may be arranged. When a plurality of magnetoresistance effect elements 12 are arranged, as exemplified in FIGS. 17(a), (b), the magnetoresistance effect elements 12a and 12b may be electrically connected in series in the longitudinal direction thereof, to form a zigzag shape (meander shape). In this case, the supply voltage Vcc is applied to one end of the magnetoresistance effect element 12a (the end which is not connected to the magnetoresistance effect element 12b), an end of the magnetoresistance effect element 12b (the end which is not connected to the magnetoresistance effect element 12) is connected to a common terminal (GND). The other end of the magnetoresistance effect element 12a or the other end of magnetoresistance effect element 12b (the ends connected to each other) defines an output terminal. Namely, the midpoint potential of a pair of magnetoresistance effect elements 12 defines an output potential. In FIG. 17, the arrow indicating the application of the supply voltage Vcc corresponds to the longitudinal direction of the magnetoresistance effect element. The right-left direction on the paper corresponds to the direction of the external magnetic field to be applied to the magnetoresistance effect element.

Further, in this case, magnetization directions of the fixed layers of the magnetoresistance effect elements 12a and 12b are constant (namely, the direction of the X-axis), and the directions are opposed to each other (reverse directions) between the magnetoresistance effect elements 12a and 12b. At this time, if the magnetization of the free layer does not smoothly rotate at the bent portions, the bent portions may be formed by a metal wire W, as exemplified in FIG. 17 (b). If the wire W is used, hysteresis of the magnetoresistance effect element 12 can be suppressed.

In this example, the magnetic field applied from the magnetic body 11 to the magnetoresistance effect element 12 is not a feedback magnetic field cancelling the magnetic field to be measured, but a bias magnetic field. Further, as exemplified in FIGS. 16 (b), (c), the magnetic body 11 may be formed without the notch U at the narrowed portion 100, and may be a shape with projecting outer periphery.

Further, in this example, the magnetic body 11 may be formed in different shapes as mentioned below, in accordance with the intensity H of the magnetic field to be measured, and the intensity Hb of the bias magnetic field. Specifically, when "b" represents the outer diameter of the magnetic body 11 in the direction of the magnetic field to be measured, and "a" represents the outer diameter of the magnetic body 11 in the direction of the bias magnetic field, which is perpendicular to the direction of the magnetic field to be measured, when H>Hb, a>b is satisfied,
when H<Hb, a<b is satisfied, and
when H and Hb are almost the same, a=b is satisfied.

Accordingly, by applying a bias magnetic field, the hysteresis of the magnetoresistance effect element 12 is decreased and the range of the linear response of the resistance value against the external magnetic field can be made wider.

The present embodiment is not limited to the above-mentioned examples. As exemplified in FIG. 18(a), a pair of magnetoresistance effect elements 12 (with their longitudinal directions match the X-axis direction) may be arranged near the center C of the magnetic body 11 exemplified in FIG. 2 along the X-axis direction (the direction perpendicular to the magnetic field to be measured), the magnetoresistance effect elements 12 having magnetization directions of the fixed layers to be opposed to each other. Further, as exemplified in FIG. 18(b), a pair of magnetoresistance effect elements 12 (with their longitudinal directions match the X-axis direction) may be arranged along the Y-axis direction (the direction of the magnetic field to be measured), the magnetoresistance effect elements 12 having magnetization directions of the fixed layers to be opposed to each other.

Further, as exemplified in FIG. 19(a), a pair of magnetoresistance effect elements 12 (with their longitudinal directions match the Y-axis direction) may be arranged near the center C of the magnetic body 11 exemplified in FIG. 15 along the Y-axis direction (the direction of the magnetic field, to be measured), the magnetoresistance effect elements 12 having magnetization directions of the fixed layers to be opposed to each other. As exemplified in FIG. 19(b), a pair of magnetoresistance effect elements 12 (with their longitudinal directions match the Y-axis direction) may be arranged along the X-axis direction (the direction perpendicular to the magnetic field to be measured), the magnetoresistance effect elements 12 having magnetization directions of the fixed layers to be opposed to each other.

Figure 19:
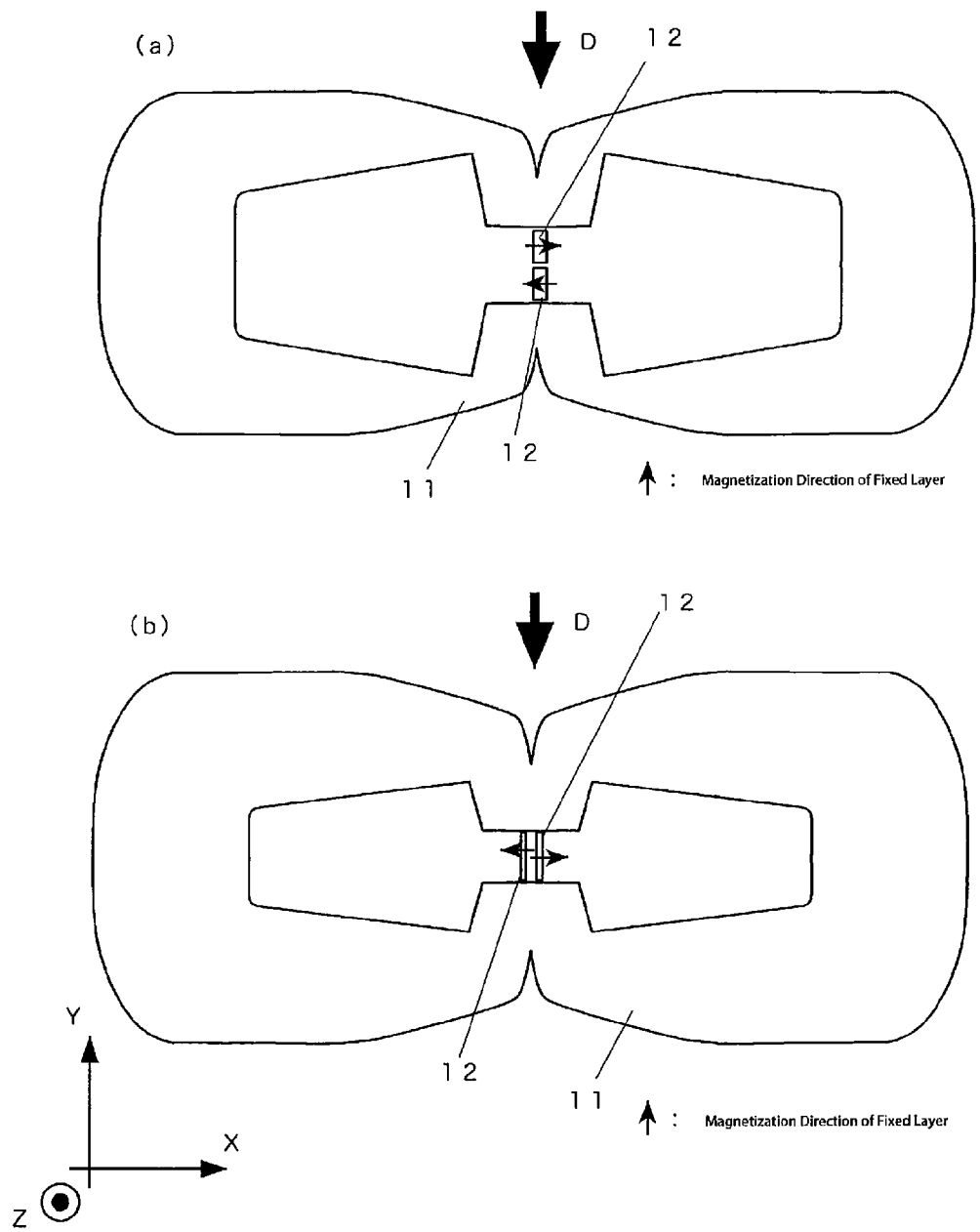
FIG. 19 is an explanatory view showing another modified schematic example of a magnetic sensor device according to an embodiment of the present disclosure.
Figure 20:
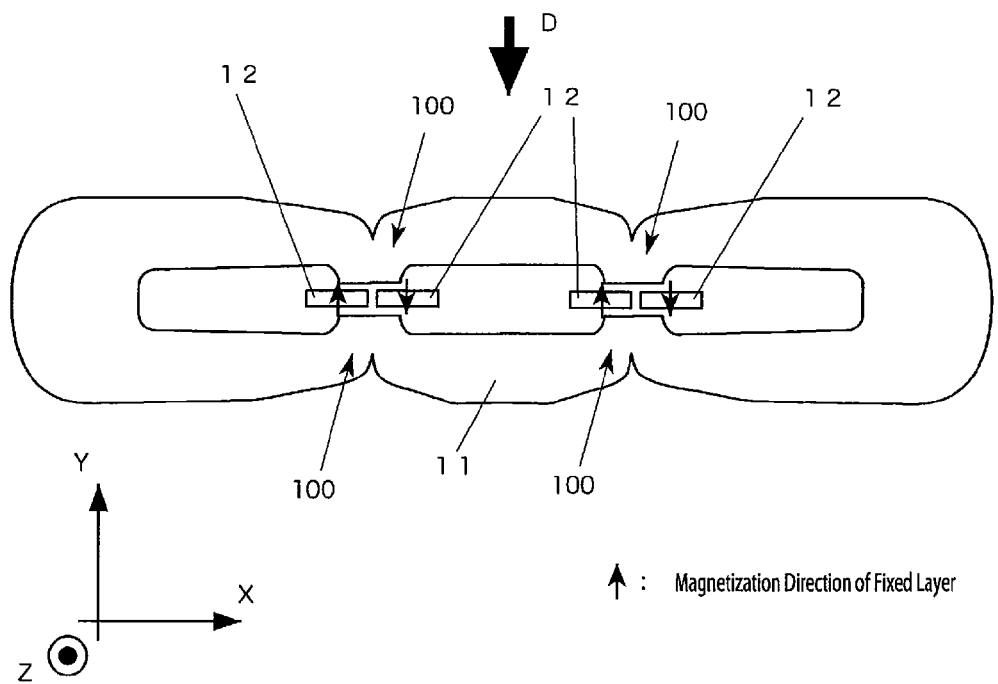
FIG. 20 is an explanatory view showing still another modified schematic example of a magnetic sensor device according to an embodiment of the present disclosure.

Further, in the magnetic body 11 according to the present embodiment, as exemplified in FIG. 20, two pairs of narrowed portions 100 opposing to each other may be formed, and a single or a pair of magnetoresistance effect element 12 may be arranged at positions between the opposing narrowed portions 100. In this case, the directions of the arranged magnetoresistance effect elements 12 may be those shown in FIG. 2 or FIG. 15, or FIG. 18 or FIG. 19. Here, if a singles magnetoresistance effect element 12 is arranged at each position, a half-bridge circuit can be structured, and if a pair of magnetoresistance effect elements 12 are arranged at each position, a full-bridge circuit can be structured.

Figure 18:
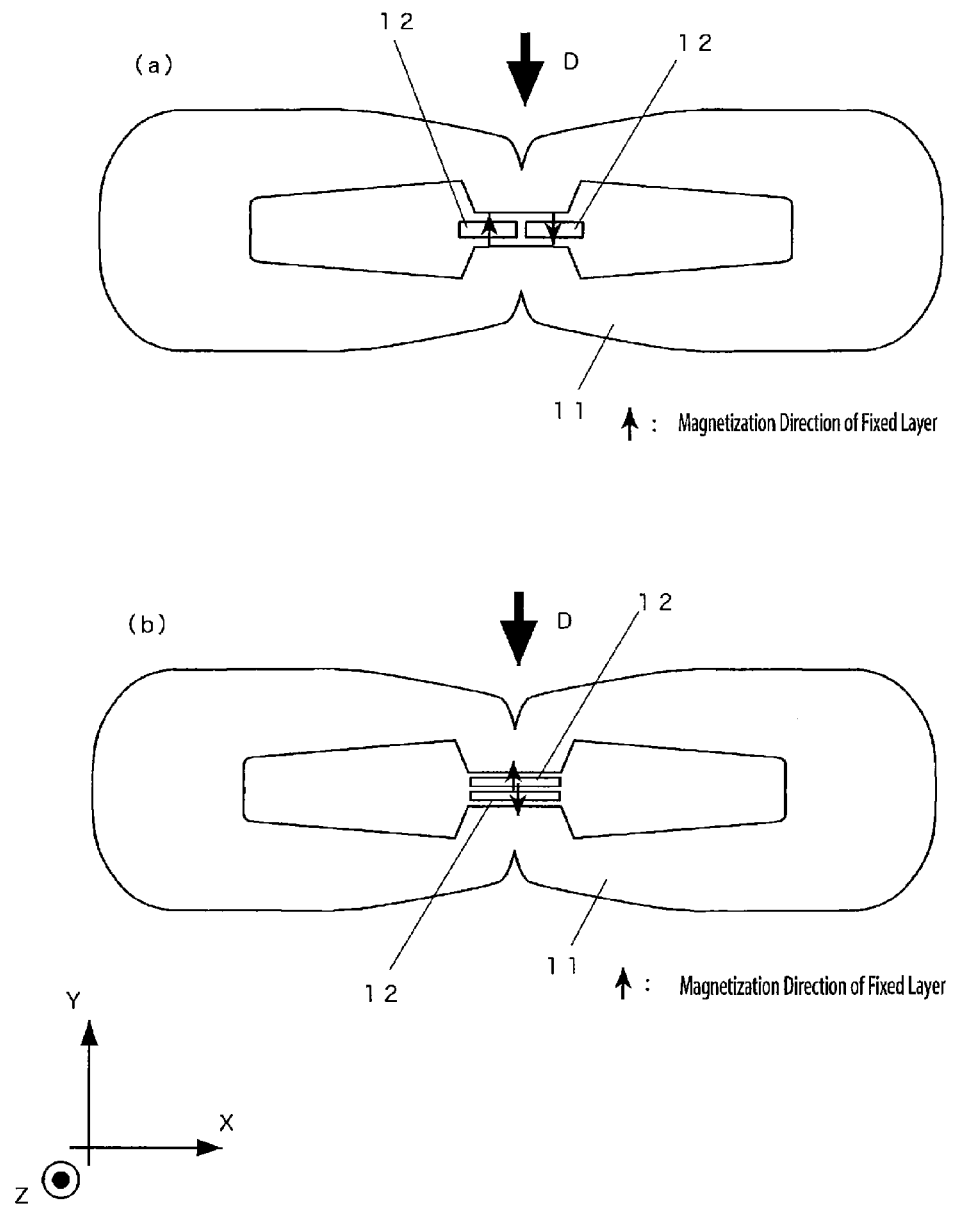
FIG. 18 is an explanatory view showing a modified schematic example of a magnetic sensor device according to an embodiment of the present disclosure.

In FIG. 18 to FIG. 20, the coil 13 is not shown in order to easily view the shape of the magnetic body 11.

Further, in the present embodiment, the shape of the magnetic body 11 is not limited to those explained above. Specifically, as exemplified in FIG. 21, the magnetic body 11 may have a shape symmetric with respect to the Y-axis, and may comprise a base portion 101 and a narrowed portion 102, the base portion 101 having a large width portion 101a located at a predetermined distance d from the center C with its width increasing as the distance d increases to the positive and negative directions in the X-axis direction, and the narrowed portion 102 having a trapezoidal shape projecting from the center of the base portion 101 toward one side of the Y-axis while being tapered.

Figure 21:
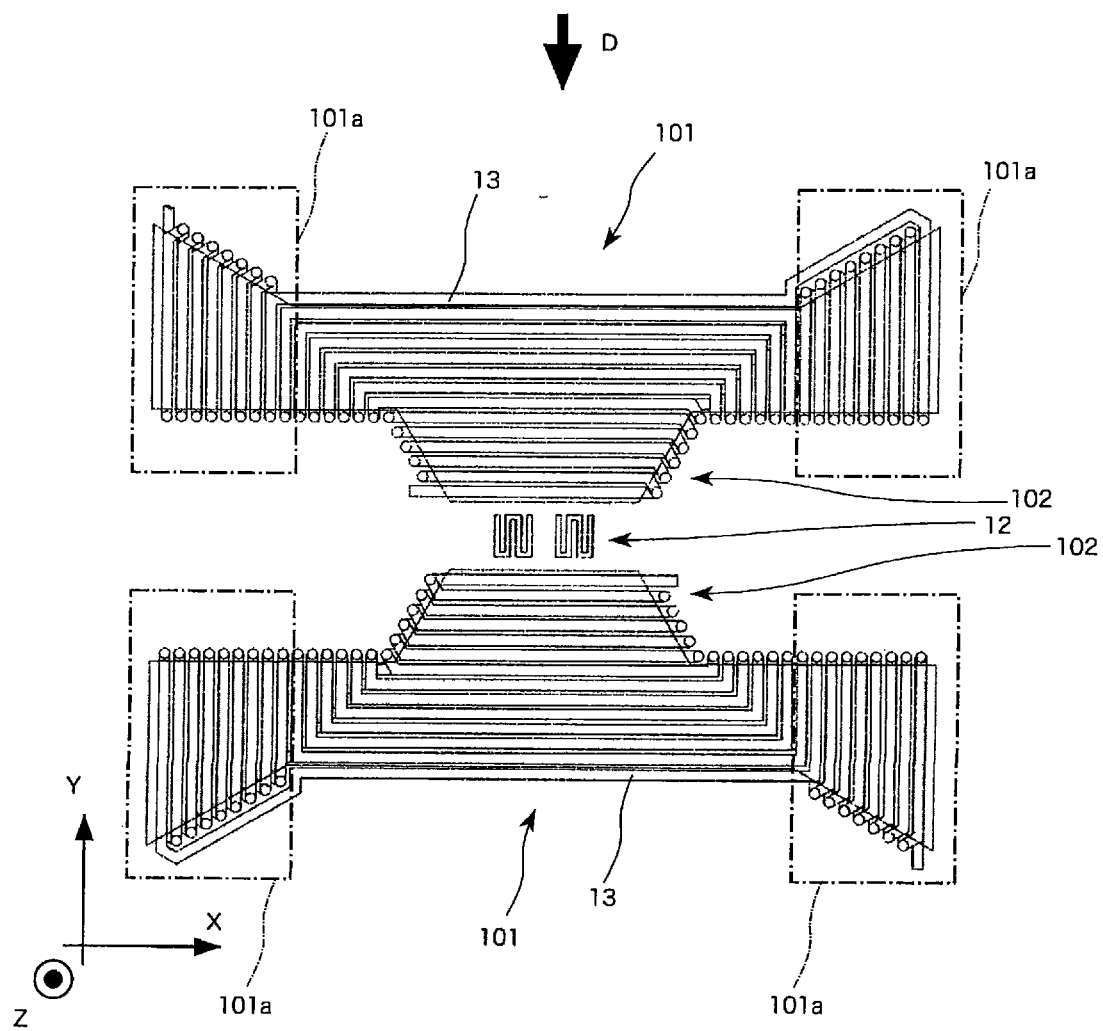
FIG. 21 is an explanatory view showing still another modified schematic example of a magnetic sensor device according to an embodiment of the present disclosure.

In this example, as shown in FIG. 21, a pair of magnetic bodies 11 are arranged symmetrically with respect to the X-axis, as the top parts of the narrowed portions 102 are opposed to each other with a predetermined space therebetween. Then, a single of a plurality of magnetoresistance effect elements 12 are arranged between the top parts of the narrowed portions 102 of the pair of magnetic bodies. In FIG. 21, a pair of meander shaped magnetoresistance effect elements 12 are arranged.

Also, in this example, a coil 13 is wound in parallel with the Y-axis, around the large width portion 101a of the magnetic body 11. The coil 13 is wound around the portion other than the large width portion 101a of the base portion 101, to have a Π-shape and to be coaxial with respect to the center C of the magnetoresistance effect element 12 (when there are a plurality of magnetoresistance effect elements 12, the center C of a virtual rectangular surrounding all the magnetoresistance effect elements 12). In addition, the coil 13 is wound around the narrowed portion 102 to be parallel to the X-axis direction. With this structure, the magnetic field surrounding the magnetoresistance effect element 12 can be also generated in the same way as the directions of magnetization are schematically shown in FIG. 1.

The aforementioned magnetic sensor device 1 according to an example of the embodiment of the present disclosure has an annular shape having an aspect ratio other than 1 (an annular shape having an ellipsoidal circumcircle). However, the present embodiment is not limited thereto.

Figure 24:
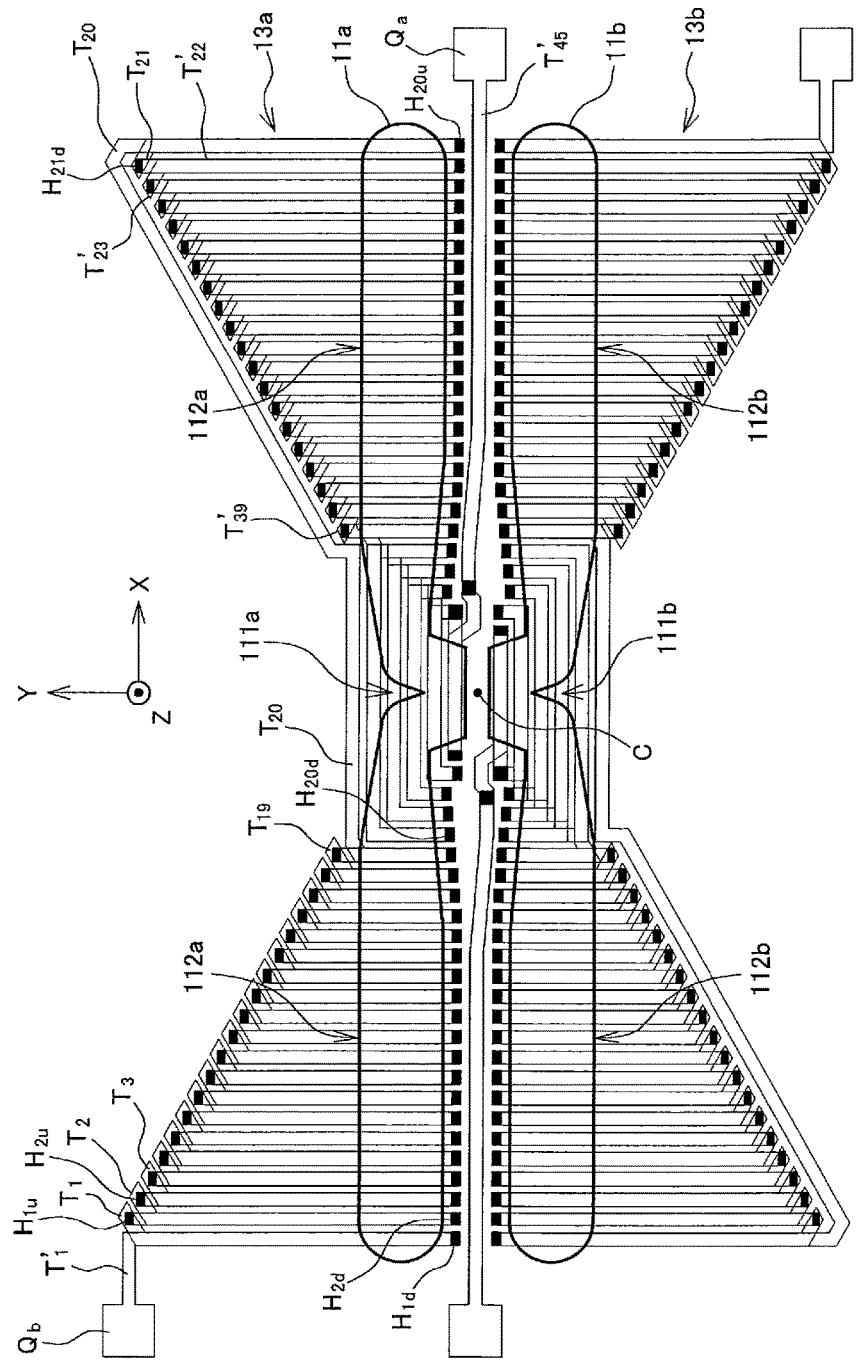
FIG. 24 is a plan view showing another structural example of a magnetic sensor device according to an embodiment of the present disclosure.
Figure 25:
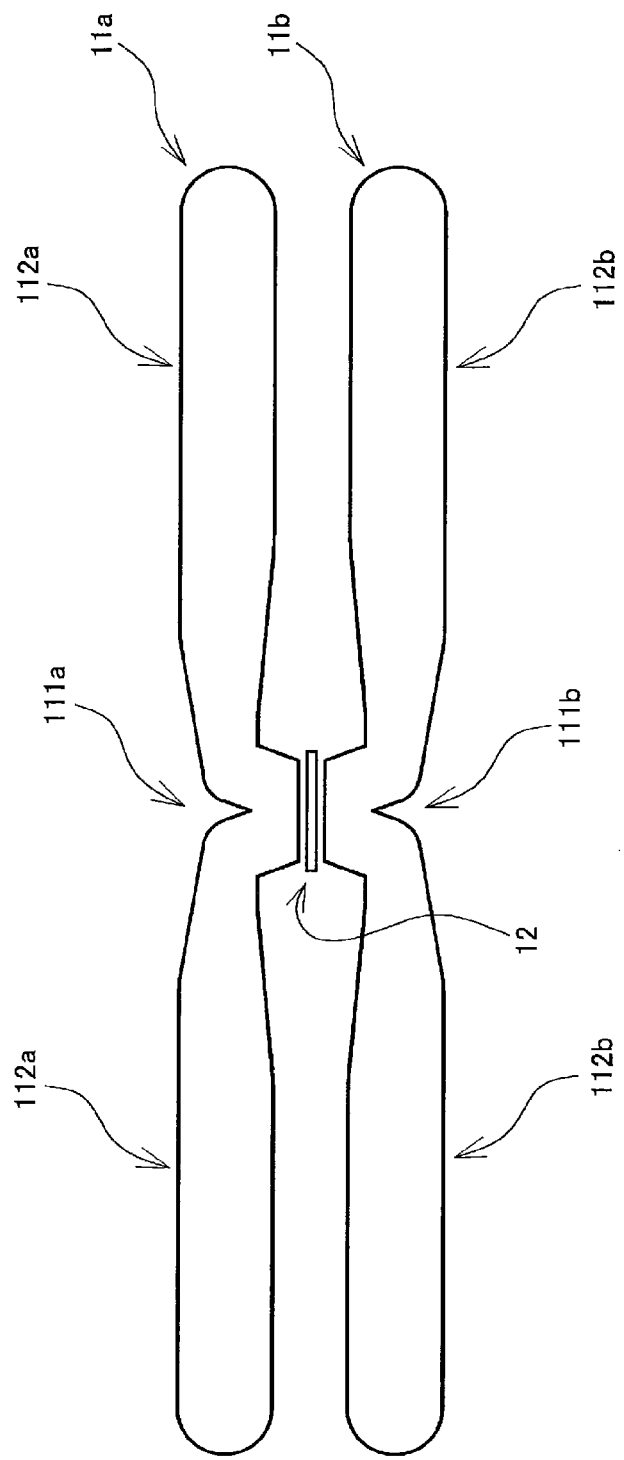
FIG. 25 is a plan view showing another an example of the shape of a magnetic body

Another example of the present embodiment (hereinafter, referred to as Type 2) of the magnetic sensor device 1 is exemplified in FIG. 24 and FIG. 25. This magnetic sensor device 1 is also arranged within a magnetic field to be measured oriented in the Y-axis direction to detect the size of the magnetic field to be measured (or the current forming the magnetic field to be measured). The magnetic sensor device 1 can be also used for detecting an angle between a bias magnetic field and an external magnetic field by applying the bias magnetic field. FIG. 24 is a plan view showing a Type 2 magnetic sensor device 1 obtained by stacking thin films, with transparent view of each layer. FIG. 25 shows a specific shape (plan view of a first magnetic body 11a and a second magnetic body 11b.

As exemplified in FIG. 24 and FIG. 25, the Type 2 magnetic sensor device 1 has a first magnetic body 11a which is provided with a first magnetic path convergence/divergence section 111a arranged on a predetermined axis (Y-axis), and a pair of first wing-shaped sections 112a extending from the first magnetic path convergence/divergence section 111a toward opposite sides in the X-axis direction perpendicular to the Y-axis. Further, the Type 2 magnetic sensor device 1 also has a second magnetic body 11b which is provided with a second magnetic path convergence/divergence section 111b arranged on the Y-axis so as to be opposed to the first magnetic path convergence/divergence section 111a of the first magnetic body 11a with a space therebetween, and a pair of second wing-shaped sections 112b extending from the second magnetic path convergence/divergence section 111b toward opposite sides in the X-axis direction. The first and second magnetic bodies 11a and 11b arranged symmetrically with respect to a virtual axis of symmetry Γ (hereinafter, referred to as an axis of symmetry Γ) extending, in the present example, in the X-axis direction.

In the present example, the ends (left ends and right ends) of the wing-shaped sections 112a and 112b of the first and second magnetic bodies 11a and 11b which are opposed with the axis of symmetry Γ therebetween, are arranged to be magnetically spaced apart from each other, the space defining a magnetic saturation suppression portion suppressing the magnetic saturation of the wing-shaped sections. Namely, the Type 2 magnetic body 11 is divided into a first magnetic body 11a and a second magnetic body 11b. The first and second magnetic bodies 11a and 11b are arranged on the same layer. In the present example, each of the first and second magnetic bodies 11a and 11b is bilaterally symmetrical, and the first and second magnetic bodies 11a and 11b are rotationally symmetric with respect to the point C where the axis of symmetry Γ intersects the Y-axis.

In this example, as shown in FIG. 25, a magnetoresistance effect element 12 is arranged between the first and second magnetic path convergence/divergence sections 111a and 111b, with its magnetic sensing direction oriented in the Y-axis direction. The magnetoresistance effect element 12 may be a SVGMR element, a multi-layered MR element, or an AMR element.

Here, the first/second magnetic path convergence/divergence section 111 may function as a convergence portion converging the magnetic lines flowing from the wing-shaped sections, or a divergence portion diverging the magnetic lines flowing from the side of opposing magnetic path convergence divergence portion 111, opposed with the axis of symmetry Γ therebetween, toward the wing-shaped sections on the opposite sides, depending on the direction of the current flowing through the coil 13, which will be described below. Namely, the first/second magnetic path convergence/divergence section 111 may diverge or converge the magnetic path, and a part thereof located along the magnetoresistance effect element 12 functions as a pole against the magnetoresistance effect element 12. The wing-shaped sections 112 define main bodies of the first and second magnetic bodies 11a and 11b.

Figure 26:
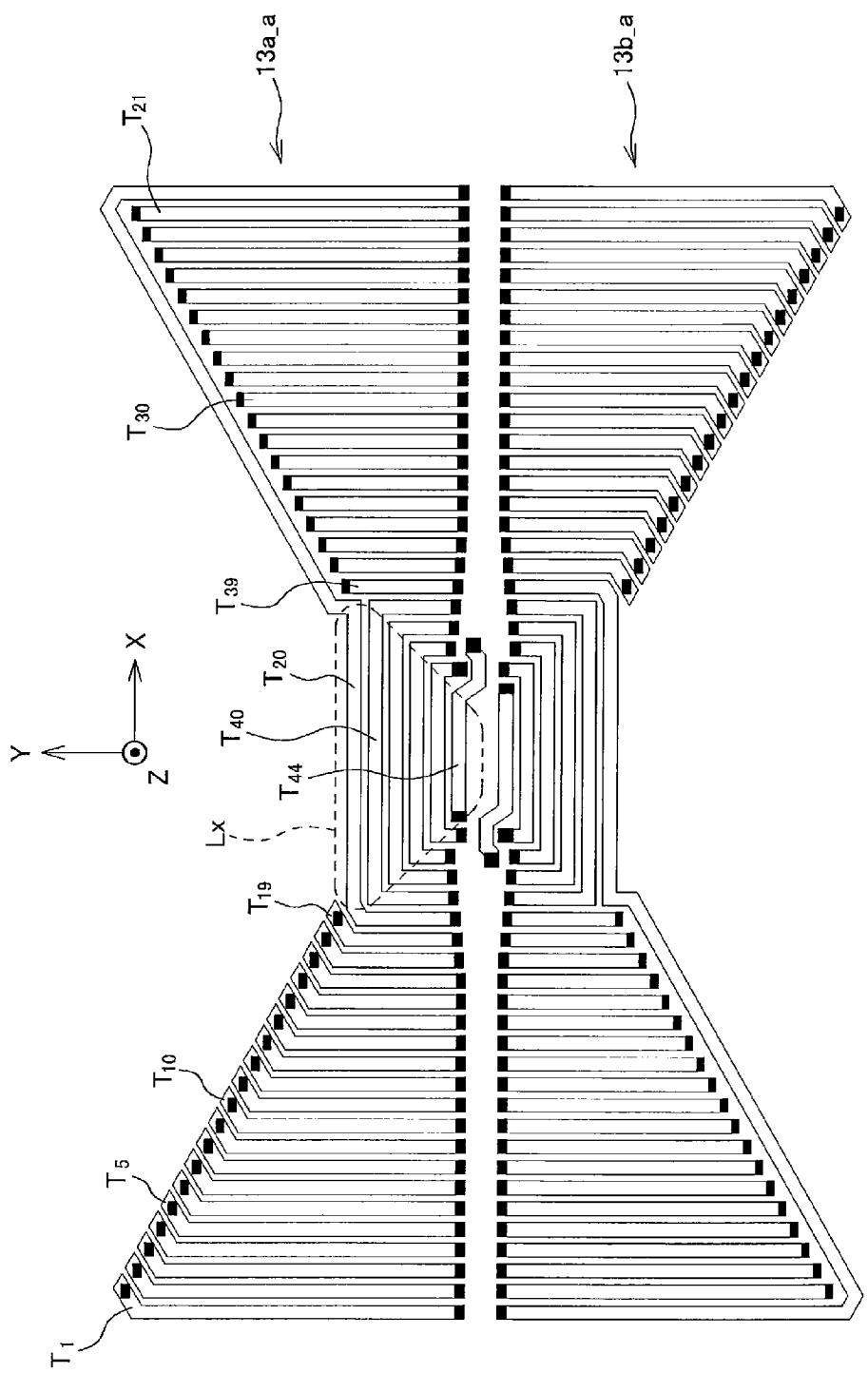
FIG. 26 is an explanatory view showing still another example of a lower coil pattern of a magnetic sensor device according to an embodiment of the present disclosure.

According to this example of the present embodiment, an insulation layer is formed on a substrate, and as shown in FIG. 26 explained below, a lower coil layer is formed on the insulation layer, and further, another insulation layer (which may be a resin, etc.) is formed for sealing, the lower coil layer being formed by arranging a lower pattern 13a_a of a first coil 13a to be would around the first magnetic body 11a, and a lower pattern 13b_a of a second coil 13b to be wound around the second magnetic body 11b, the patterns being made of aluminum. Thereafter, a layer containing the magnetoresistance effect element 12 and the first and second magnetic bodies 11a and 11b is formed by thin film processes. The layer containing the magnetic bodies 11, is sealed by an insulation layer, and via holes H are formed at predetermined positions of the insulation layer, to connect conductors at corresponding positions on the winding wire (lower patterns 13a_a and 13b_a) of the coil 13. Next, the remaining portions of the winding wire of the coil to be connected to the conductors (upper patterns 13a_b and 13b_b) is formed by for example, aluminum, and sealed by a resin, etc. In this case, the magnetoresistance effect element 12 is located substantially the same layer as the magnetic bodies 11. As mentioned above, then each of the first and second magnetic bodies 11a and 11b is treated as separated into the magnetic path convergence/divergence section 111 and the wing-shaped section 112, it can be said that coils respectively wound around these portions are formed, and the coils are connected to each other.

The first magnetic body 11a and the second magnetic body 11b are, for example, an alloy of iron and nickel (permalloy), and according to an example of the present embodiment, each has a thickness of 400 nm, a saturation magnetic flux density Bs of 1 T, and an initial magnetic permeability μi of 2000. Each insulation layer has a thickness of 1 μm.

As shown in FIG. 25, the first and second magnetic path convergence divergence portions 111a and 111b of the first and second magnetic bodies 11a and 11b have a convex shape projecting in the width direction (the direction perpendicular to the X-axis within the layer, hereinafter, referred to as the Y-axis direction) toward the side where they oppose to each other. The convex portion may have a width decreasing toward the axis of symmetry Γ (tapered). Further, a concave portion is formed on the side of each of the first and second magnetic path convergence divergence portions 111a and 111b, opposite to the side where the axis of symmetry Γ locates (on the side opposite to the side where the convergence divergence portions are faced to each other).

Figure 27:
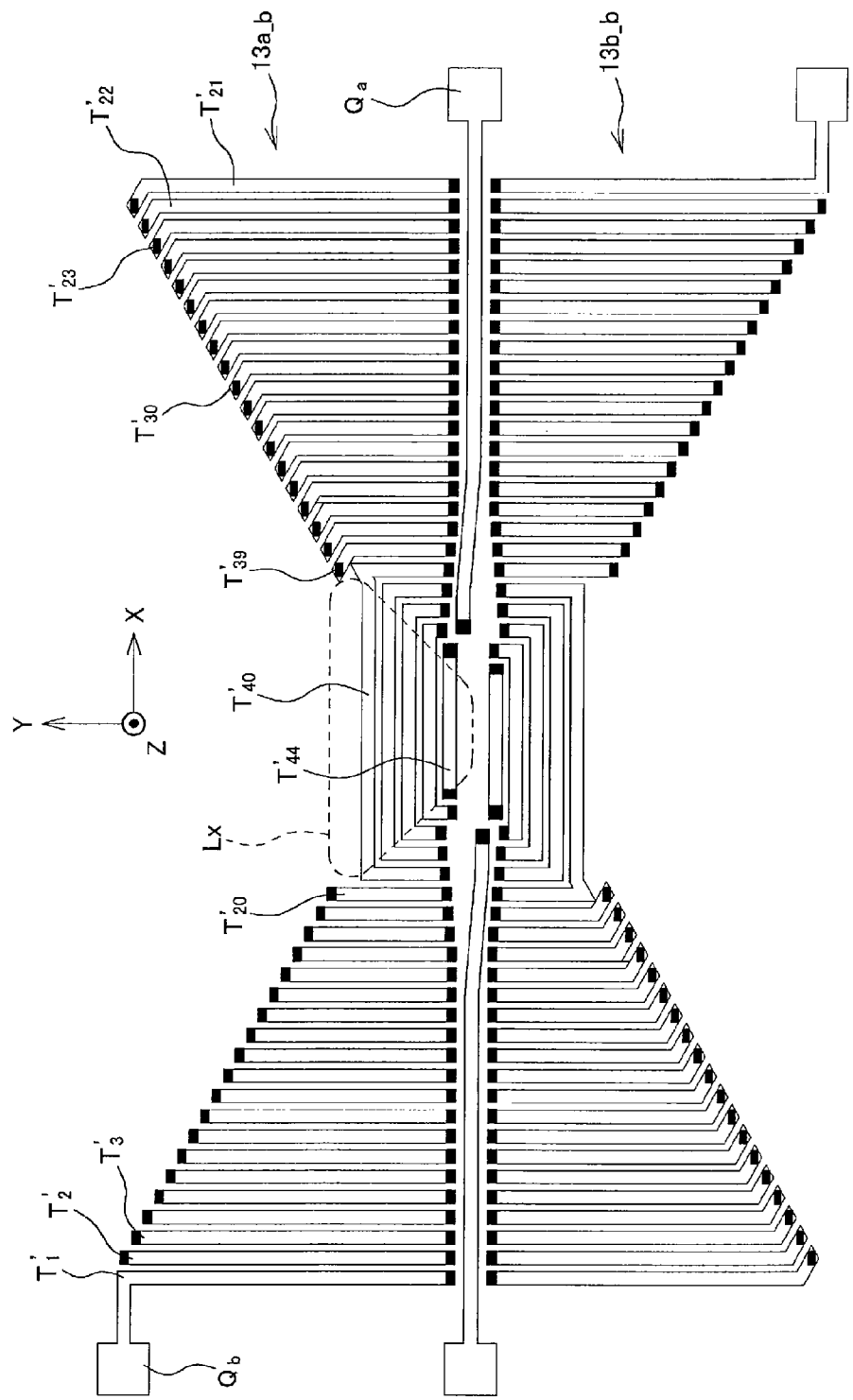
FIG. 27 is an explanatory view showing still another example of an upper coil pattern of a magnetic sensor device according to an embodiment of the present disclosure.

Next, FIG. 26 shows the patterns 13a_a and 13b_a of the lower coil layer of the first and second coils 13a and 13b. FIG. 27 shows the patterns 13a_b and 13b_b of the upper coil layer of the first and second coils 13a and 13b. In FIG. 26 and FIG. 27, the portions indicated by blacked out rectangles H are the positions of the via holes, and the patterns 13a_b or 13b_b of the upper coil layer and the corresponding patterns 13a_a or 13b_a of the lower coil layer are electrically connected through the via holes located at the positions indicated by the rectangles H.

In both FIG. 26 and FIG. 27, at least a part of the winding wires of the coil 13 has a wire arrangement substantially parallel to the Y-axis. The wire arrangement of these wires may be formed so that the closer to the magnetic path convergence/divergence sections 111a and 111b, the shorter the length in the Y-axis direction. Further, a portion of the wire arranged to be inclined relative to the Y-axis (a portion inclined at an angle within a predetermined angle range relative to the peripheral direction of the magnetic body, hereinafter, referred to as an inclined portion) is extended from each portion of the wire patterned in parallel with the Y-axis, and the inclined portion is connected through the via hole to an adjacent portion in the pattern.

Further, as shown in FIG. 26 and FIG. 27, a part of the pattern corresponding to the coil 13 portion wound around the magnetic path convergence/divergence section 111, includes portions LX arranged parallel to the X-axis. A portion parallel to the Y-axis is extended from each of the opposite ends of the portions LX parallel to the X-axis, and as a whole, a bracket shape similar to the shape of letter C can be formed. Namely, according to the present embodiment, there are a portion of the coil 13 to form a pattern part with an arrangement parallel to the Y-axis (referred to as a first coil element), and a portion of the coil to form a pattern part with a C-letter like bracket shaped arrangement (referred to as a second coil element), the first coil element being adjacent to the second coil element. The direction of the magnetic field formed by the first coil element is parallel to the X-axis, and the direction of the magnetic field formed by the second coil element is oriented toward the side of the axis of symmetry Γ of magnetic path convergence divergence sections 111 and is inclined relative to the X-axis. Namely, the direction of the magnetic fields respectively formed by the first coil element and the second coil element (mutually adjacent coil elements) are inclined with each other (different between the adjacent coil elements). Here, a coil piece refers to a wire wound around the magnetic body for one round, the coil element refers a plurality of coil pieces connected in series.

Specifically, in the example shown in FIG. 27, the winding wire T1' in the upper pattern 13a_b of the first coil 13a is connected to the pad Qb. This wire T1' extends on the first wing-shaped section 112a of the first magnetic body 11a in the Y-axis direction, and is connected, through the conductive wire in the via hole H1d arranged in a gap between the first magnetic body 11a and the second magnetic body 11b, to the winding wire T1 of the lower pattern 13a_a shown in FIG. 26. The wire T1 of the lower pattern 13a_a extends on the first wing-shaped section 112a of the first magnetic body 11a in the Y-axis direction. An inclined portion is extended from the winding wire T1, and the end of the inclined portion is connected, through a conductive wire within the via hole H1u, to the winding wire T2' of the upper pattern 13a_b.

The winding wire T2' further extends on the first wing-shaped section 112a of the first magnetic body 11a in the Y-axis direction, and is connected through a conductive wire in the via hole H2d, to the winding wire T2 of the lower pattern 13a_a. An inclined portion is extended from the winding wire T2, and the end of this inclined portion is connected, through a conductive wire in the via hole H2u, to the adjacent winding wire T3' of the upper pattern 13a_b. Subsequently, the winding wires T3, T3', T4, . . . , T19 are wound around the magnetic body 11 in the direction parallel with the Y-axis, while the wires alternatively extend on the lower pattern 13a_a and the upper pattern 13a_b through the conductive wires within the corresponding via holes.

Further, the winding wire T20' in the upper pattern 13a_b is connected through the via hole H20d to the winding wire T20 in the lower pattern 13a_a. The winding wire T20 extends on the first wing-shaped section 112a of the first magnetic body 11a in the Y-axis direction, then, extends on the first magnetic path convergence/divergence section 111a over its enter length (then length in the X-axis direction) in the X-axis direction, further extends obliquely along the outer periphery of the winding wires T39 to T21, and then, extends on the right side of the winding wire T21 in the direction parallel to the Y-axis direction, on the first wing-shaped section 112a (right side) of the first magnetic body 11a. Then, the winding wire T20 is connected, thorough the via hole H20u, to the winding wire T21' in the upper pattern 13a_b. The winding wire T21' extends on the in the direction parallel to the Y-axis on the first wing-shaped section 112a (right side) of the first magnetic body 11a, and is connected through the via hole H21d to the winding wire T21 of the lower pattern 13a_a.

Subsequently, the winding wires T22', T22, T23', . . . , T39 are wound around the magnetic body 11 in the direction parallel with the Y-axis, while the wires alternatively extend on the lower pattern 13a_a and the upper pattern 13a_b through the conductive wires within the corresponding via holes. The winding wire T39 is connected through the via hole H39u to the winding wire T40' in the upper pattern 13a_b. The winding wire T40' extends on the first magnetic path convergence/divergence section 111a to form the shape of the letter C, and is connected through the via hole H40d to the winding wire T40 in the lower pattern 13a_a. Subsequently, the winding wires T41', T41, T42', . . . , T44 are wound around the first magnetic path convergence/divergence section 111a to form a substantially C-shape, while the wires alternatively extend on the lower pattern 13a_a and the upper pattern 13a_b through the corresponding via holes. The winding wire T44 in the lower pattern 13a_a is connected, through the conductive wire in the via hole H44u, to the conductive wire T45' in the upper pattern 13a_b, the conductive wire T45' extending between the first and second magnetic bodies 11a and 11b substantially in the X-axis direction and being connected to the external pad Qa.

The second coil 13b is wound around the second magnetic body 11b in the same way as the first coil 13a. The second coil 13b is wound around the second magnetic body 11b in the way that the first coil 13a is reversed 180 degrees (rotationally symmetric with respect to the point C).

Since the coils 13a and 13b are respectively wound around the first and second magnetic bodies 11a and 11b as aforementioned, when, for example, a coil current Ic is applied to the pad Qa which is connected to the first coil 13a to flow the current from the pad Qa to the pad Qb, a magnetic field oriented from the opposite ends of the first wing-shaped section 112a toward the first magnetic path convergence/divergence section 111a is formed. Further, at the first magnetic path convergence/divergence section 111a, magnetic lines flowing from the opposite ends of the first wing-shaped section 112a converge. A portion of the coil 13 wound around the magnetic path convergence/divergence section 111a of the first magnetic body 11a forms a magnetic path toward the second magnetic path convergence/divergence section 111b of the second magnetic body 11b.

At this time, a current is applied to the second coil 13b wound around the second magnetic body 11b to form magnetic fields oriented from the second magnetic path convergence/divergence section 111b toward the opposite ends of the wing-shaped section 112b, respectively. Namely, the pad Qb of the second coil 13b is connected to the pad Qa of the first coil 13a, and the pad Qa of the second coil 13b is connected to a common terminal (GND). Then, the coil current Ic is applied to the pad Qa of the first coil 13a. Thereby, a magnetic path is formed, through which the magnetic lines flowing from the first magnetic body 11a diverge at the second magnetic path convergence/divergence section 111b, and flow towards the opposite ends of the wing-shaped section 112b.

Figure 43:
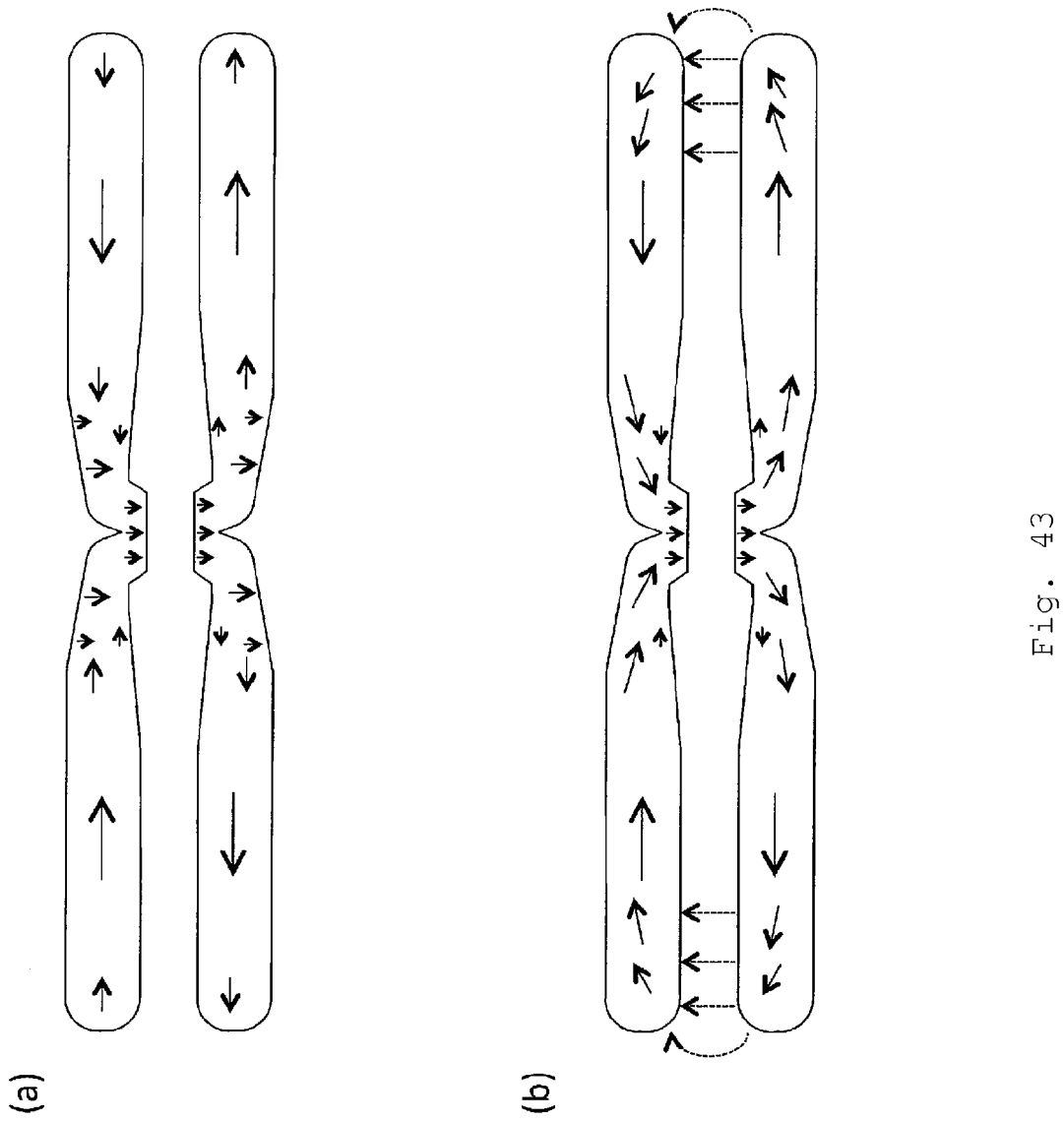
FIG. 43 is an explanatory view showing an example of a magnetic body of a magnetic sensor device according to an embodiment of the present disclosure.
Figure 44:
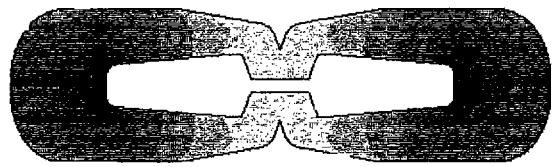
FIG. 44 is an explanatory view showing a flux density distribution at magnetic equilibrium of a magnetic sensor device according to an embodiment of the present disclosure.
Figure 44:
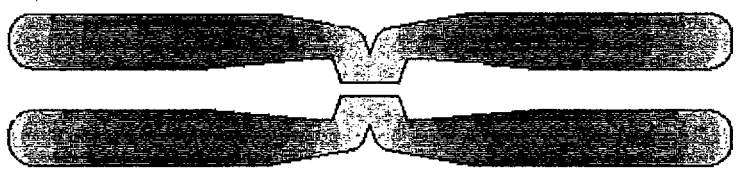
Figure 44:
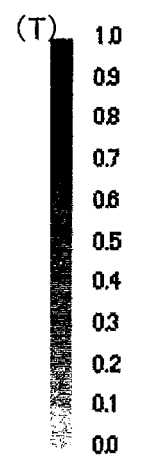

Specifically, FIG. 43 (a) shows magnetic fields formed by the coils 13a and 13b, and FIG. 43(b) shows distribution of magnetization within the first and second magnetic bodies 11a and 11b. As shown in FIG. 43 (b), when supposing an ellipsoidal shape circumscribing both the first and second magnetic bodies 11a and 11b, magnetization distribution is formed from the left end in the figure to make a 360-degree clockwise rotation of the directions of the magnetic fields over the half of the periphery of the circumscribing ellipsoidal shape. The magnetoresistance effect element 12 is located where the magnetic fields converge, and thus, the magnetic fields can be efficiently applied to the magnetoresistance effect element 12. The circuit used at this time may be similar to those exemplified in FIG. 13 and FIG. 14, and thus, the explanation therefor is not repeated and is omitted. FIG. 44 is a reference drawing showing magnetic flux density distributions within Type 1 and Type 2 magnetic bodies, respectively.

When the current is applied to flow through the coils 13a and 13b in reverse, the magnetic lines flowing from the opposite ends of the second wing-shaped section 112b converge at the second magnetic path convergence/divergence section 111b of the second magnetic body 11b, and the magnetic lines flowing from the second magnetic body 11b diverge at the first magnetic path convergence/divergence section 111a of the first magnetic body 11a. Accordingly, the magnetic field (feedback magnetic field) applied to the magnetoresistance effect element 12 by the coils 13a and 13b respectively wound around the first and second magnetic bodies 11a and 11b is oriented in the reverse direction to the direction of the magnetic field to be measured.

The number of winding wires in the coil explained above is not limited to those in the examples shown in FIG. 26 and FIG. 27, and the number may be larger or smaller than those in the examples shown in FIG. 26 and FIG. 27. Further, in FIG. 26 and FIG. 27, the pattern with the arrangement parallel to Y-axis direction is formed so that the closer to the first and second magnetic path convergence/divergence sections 111a and 111b, the shorter the length in the Y-axis direction. Also, magnetic bodies 11 have smaller widths on the side near the first and second magnetic path convergence/divergence sections 111a and 111b to have larger distances between the magnetic bodies 11 and the axis of symmetry Γ, respectively. Accordingly, the coils 13 wound around the magnetic bodies are also formed to have larger distances from the axis of symmetry Γ near the first second magnetic path convergence/divergence sections 111a and 111b. However, the present embodiment is not limited thereto.

Figure 28:
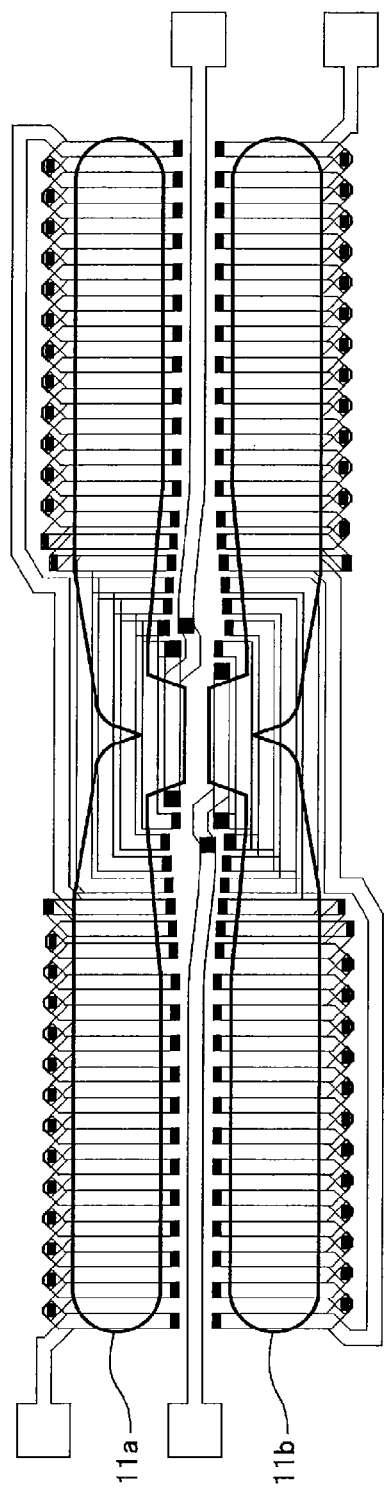
FIG. 28 is a plan view showing another structural example of a magnetic sensor device according an embodiment of the present disclosure.

FIG. 28 shows a magnetic sensor device 1 according to still another example of the present embodiment (hereinafter, referred to as Type 3). Type 3 magnetic sensor device 1 is obtained by stacking thin films, similar to Type 2 magnetic sensor device 1. The shape of the magnetic body 11, and how the layers are stacked, are the same as those in Type 2. However, Type 3 is different from Type 2 in terms of the coil 13. FIG. 28 is a plan view showing Type 3 magnetic sensor device 1 obtained by stacking thin films, with transparent view of each layer.

Figure 29:
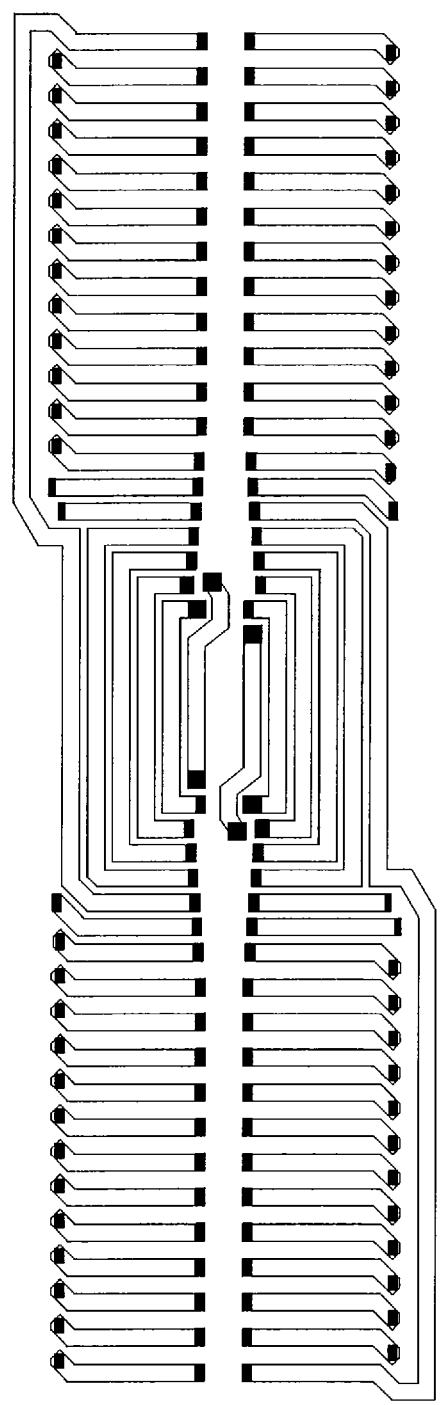
FIG. 29 is an explanatory view showing another example of a lower coil pattern of a magnetic sensor device according to an embodiment of the present disclosure.
Figure 30:
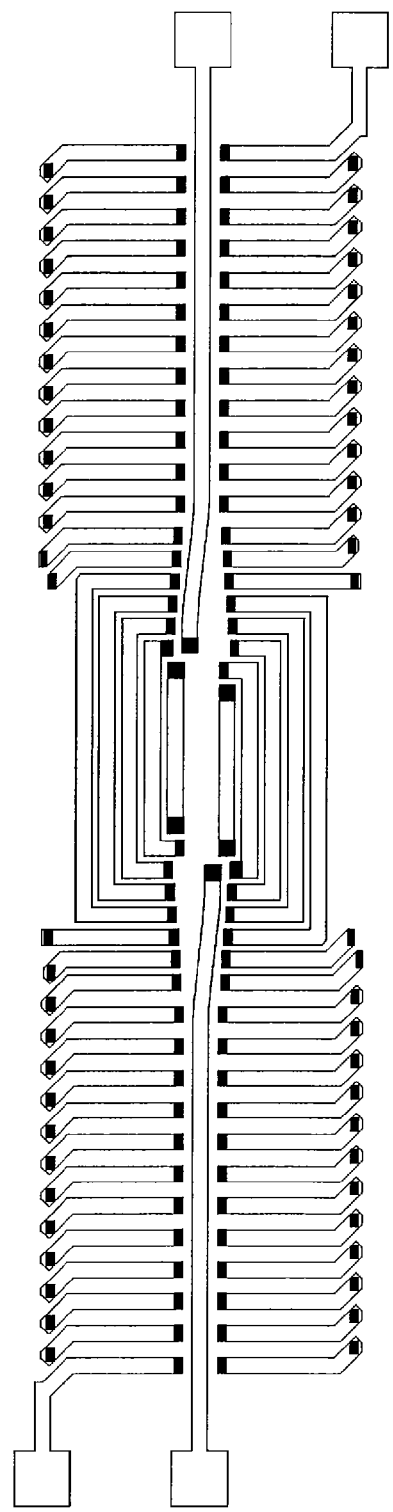
FIG. 30 is an explanatory view showing still another example of an upper coil pattern of a magnetic sensor device according to an embodiment of the present disclosure.

FIG. 29 shows an example of lower patterns 13a_a and 13b_a of the first and second coils 13a and 13b in Type 3 magnetic sensor device 1. FIG. 30 shows an example of upper patterns 13a_b and 13b_b of the first and second coils 13a and 13b in Type 3 magnetic sensor device 1. In FIG. 29 and FIG. 30, the portions indicated by blacked out rectangles H are the positions of the via holes, and the upper patterns 13a_b or 13b_b and the corresponding lower patterns 13a_a or 13b_a of the lower coil layer are electrically connected through the corresponding via holes located at the positions indicated by the rectangles H.

In both examples shown in FIG. 29 and FIG. 30, at least a part of the pattern defined by the winding wires of the coil 13 has a wire arrangement substantially parallel to the Y-axis. Unlike the pattern in Type 2 magnetic sensor device 1, in this pattern, the Y-axis direction lengths of the wires of the patterned coil 13 arranged in parallel with the Y-axis are substantially the same, the length being defined from the end on the upper/lower side of the magnetic body 11 to the other end on the side where the magnetic bodies are closed to each other.

Further, a portion of the wire arranged to be inclined relative to the Y-axis (a portion inclined at an angle within a predetermined angle range relative to the peripheral direction of the magnetic body, hereinafter, referred to as an inclined portion) is extended from each portion of the wire patterned in parallel with the Y-axis, and the inclined portion is connected through the via hole to an adjacent portion in the pattern.

Since the coils 13a and 13b are respectively wound around the first and second magnetic bodies 11a and 11b as aforementioned, when, for example, a current is applied to flow from the pad Qa which is connected to the first coil 13a to the pad Qb, a magnetic field oriented from the opposite ends of the first wing-shaped section 112a toward the first magnetic path convergence/divergence section 111a is formed. Further, at the first magnetic path convergence/divergence section 111a, magnetic lines flowing from the opposite ends of the first wing-shaped section 112a converge. A portion of the coil 13 wound around the magnetic path convergence/divergence section 111a of the first magnetic body 11a forms a magnetic path toward the second magnetic path convergence/divergence section 111b of the second magnetic body 11b.

At this time, a current is applied to the second coil 13b wound around the second magnetic body 11b to form magnetic fields oriented from the second magnetic path convergence/divergence section 111b toward the opposite ends of the wing-shaped section 112b, respectively. Thereby, a magnetic path is formed, through which the magnetic lines flowing from the first magnetic body 11a diverge at the second magnetic path convergence/divergence section 111b, and flow towards the opposite ends of the wing-shaped section 112b. Accordingly, the magnetoresistance effect element 12 is located where the magnetic fields converge, and thus, the magnetic fields can be efficiently applied to the magnetoresistance effect element 12.

When the current is applied to flow through the coils 13a and 13b in reverse, the magnetic lines flowing from the opposite ends of the second wing-shaped section 112b converge at the second magnetic path convergence/divergence section 111b of the second magnetic body 11b, and the magnetic lines flowing from the second magnetic body 11b diverge at the first magnetic path convergence/divergence section 111a of the first magnetic body 11a.

Figure 31:
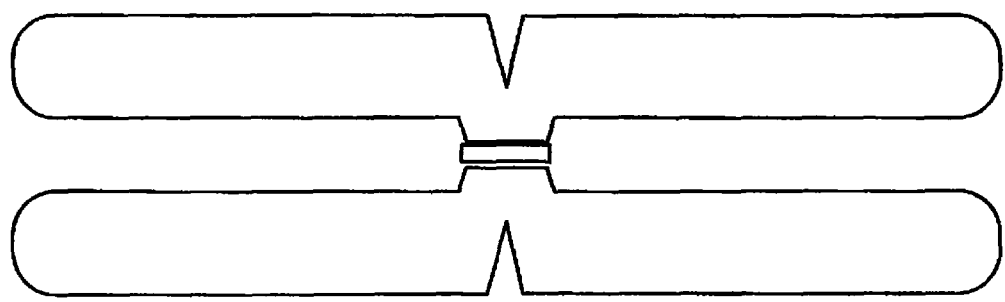
FIG. 31 is an explanatory view showing an example of a magnetic body of a magnetic sensor device according to an embodiment of the present disclosure.
Figure 32:
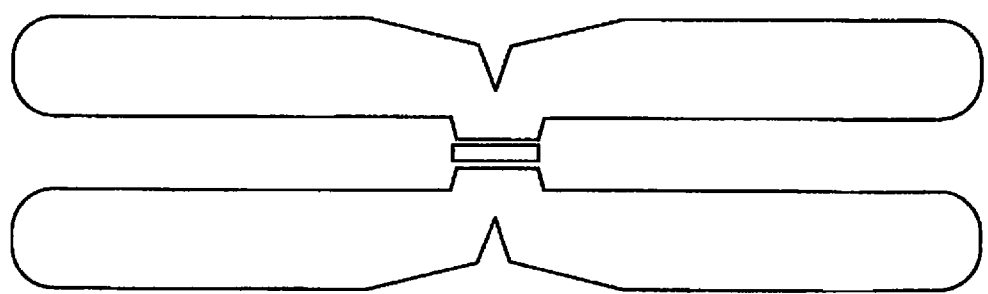
FIG. 32 is an explanatory view showing another example of a magnetic body of a magnetic sensor device according to an embodiment of the present disclosure.
Figure 33:
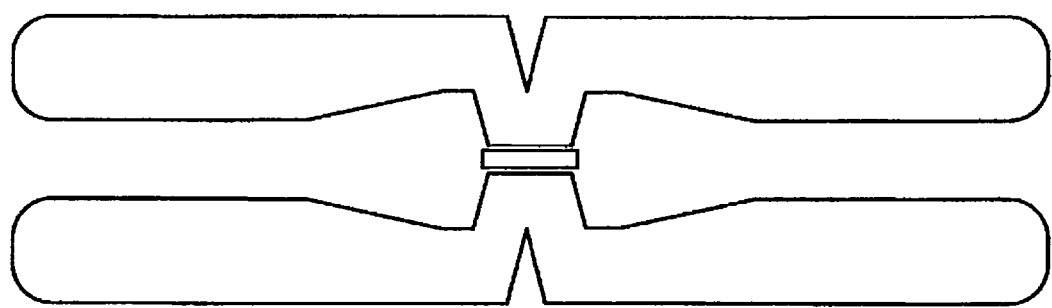
FIG. 33 is an explanatory view showing still another example of a magnetic body of a magnetic sensor device according to an embodiment of the present disclosure.

The number of winding wires in the coil explained above is not limited to those in the examples shown in FIG. 29 and FIG. 30, and the number may be larger or smaller. The coil does not have to be a winding type, but can be a planar coil provided with a magnetic body 11 on the upper face or the lower face of the coil. Namely, as far as a magnetic field substantially equivalent to the magnetic field formed by the coil in FIG. 24 can be formed, the arrangement or the shape of the coil is not limited. The shape of the magnetic body 11 in the Type 2 or Type 3 magnetic sensor device 1 is not limited to those shown in FIG. 24 and FIG. 28, but can be the one provided with a constant-width wing-shaped section as exemplified in FIG. 31, or the one provided with a wind-shaped section wherein the side facing to the axis of symmetry Γ is linear as exemplified in FIG. 32. Further, as exemplified in FIG. 33, the side of the wing-shaped section located on the side opposite to the axis of symmetry Γ may be linear. In the example of FIG. 33, the side of wing-shaped section facing to the axis of symmetry Γ may be formed so that, within a predetermined range from the magnetic path convergence/divergence section, the closer to the magnetic path convergence/divergence section, the larger the distance from the axis of symmetry Γ, namely, within a predetermined range from the magnetic path convergence/divergence section, the closer to the magnetic path convergence/divergence section, the smaller the width of the wing-shaped section.

Figure 34:
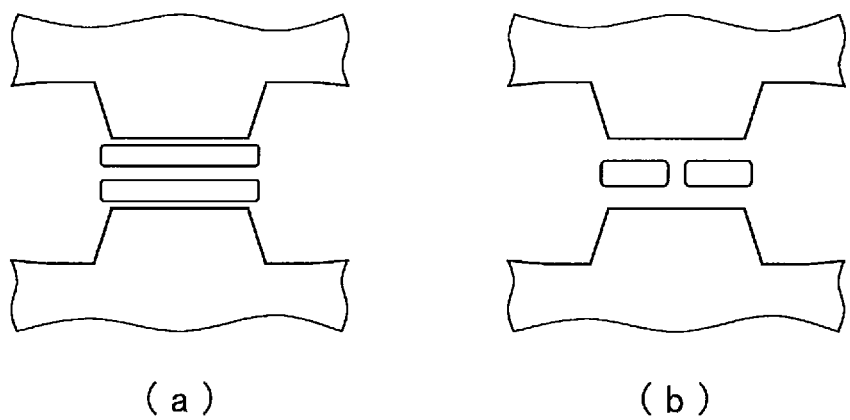
FIG. 34 is an explanatory view showing an example regarding the arrangement of a magnetoresistance effect element of a magnetic sensor device according to an embodiment of the present disclosure.

In addition, in Type 2 or Type 3 magnetic sensor device 1, the number of magnetoresistance effect element 12 provided between the first magnetic path convergence/divergence section 111a and the second magnetic path convergence/divergence section 111b does not have to be one. When a plurality of magnetoresistance effect elements 12 are provided between the first magnetic path convergence/divergence section 111a and the second magnetic path convergence/divergence section 111b, they may be arranged in parallel with the axis of symmetry Γ as exemplified in FIG. 34(a), or may be juxtaposed along the axis of symmetry Γ as exemplified in FIG. 34 (b). In the figures showing an embodiment of the present disclosure, when the magnetoresistance effect element is not shown, the magnetoresistance effect element may be arranged as shown in any of FIG. 31 to FIG. 33.

In the aforementioned explanation regarding Type 2 or Type 3 magnetic sensor device 1, layers respectively including the lower coil 13a and the upper coil 13b are stacked to hold the magnetic body 11 therebetween. However, the present embodiment is not limited thereto. Namely, according to an example of the present embodiment, a first layer including an auxiliary magnetic body 11' having the substantially same shape as the magnetic body 11 around which the coil 13 is wound, a second layer including the lower coil 13a, a third layer including the magnetic body 11, a fourth layer including the upper coil 13b, and a fifth layer including an auxiliary magnetic body 11' having the substantially same shape as the magnetic body 11 around which the coil 13 is wound, are sequentially stacked in this order. This structure corresponds to the one wherein magnetic sensor device 1 according to aforementioned examples is held between the layers each including an auxiliary magnetic body 11' having the substantially same shape as the magnetic body 11.

Figure 35:
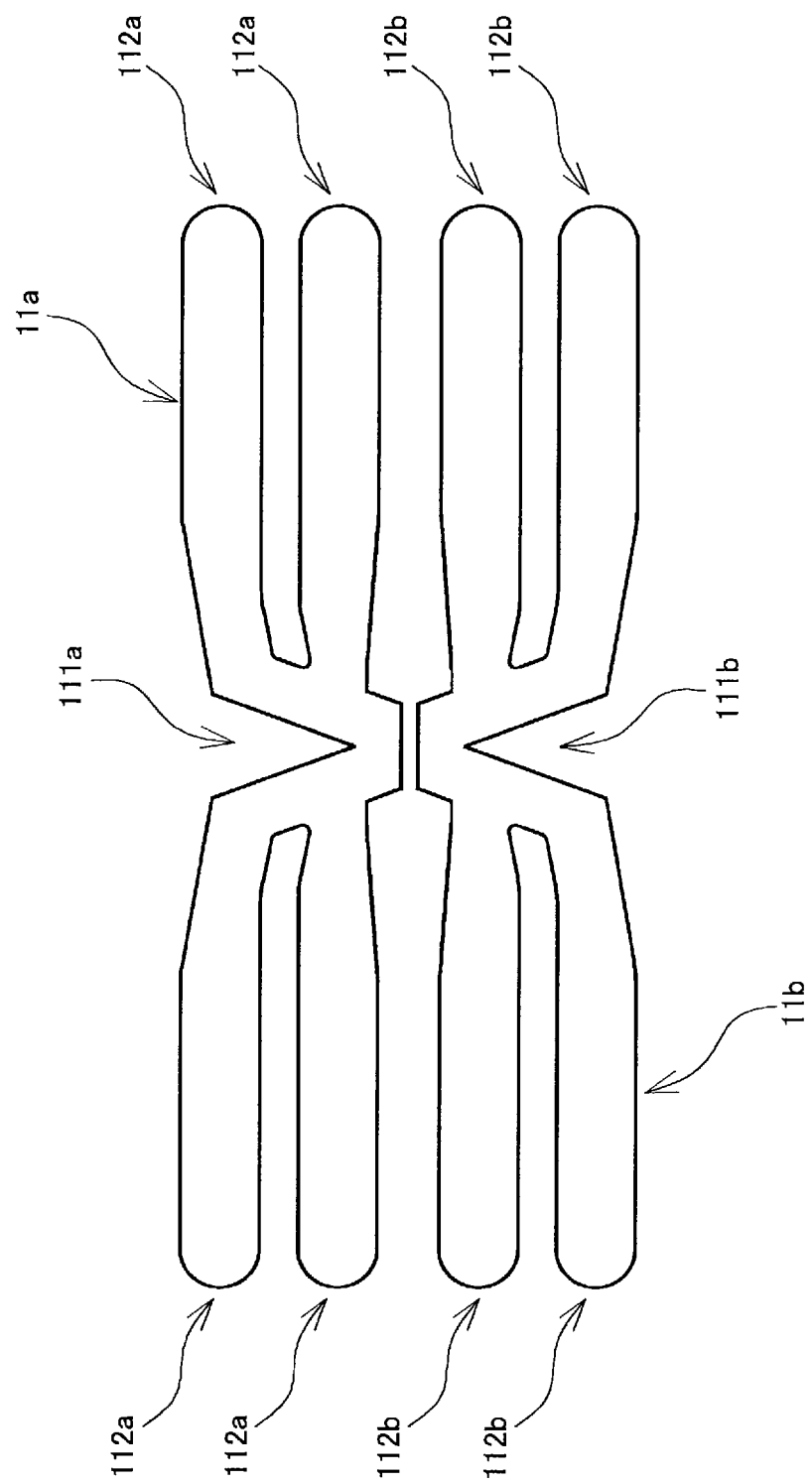
FIG. 35 is an explanatory view showing still another example of a magnetic body of a magnetic sensor device according to an embodiment of the present disclosure.

In addition, each magnetic body 11 may be provided with, not only a wing-shaped section 112, but also a larger number of wing-shaped sections 112, on each of the right and left sides. Specifically, the magnetic body exemplified in FIG. 35 is provided with two wing-shaped sections 112 on each of the right and left sides of the magnetic path convergence/divergence section 111. In this example, coil 13 is arranged to cross the two wing-shaped sections 112 located of each of the right and left sides in the Y-axis direction. When there are 2N pieces (N pairs) of wing-shaped sections, and the coils forming the magnetic field for the respective wing-shaped sections are substantially equivalent, 2N times of the magnetic fields are provided to the magnetic path convergence/divergence section, compared to the case with a pair of wing-shaped sections. Therefore, a necessary feedback magnetic field can be obtained with less current consumption (even if a smaller current is applied to the coil).

Further, at least a pair of wing-shaped members 112' made of the same material as the magnetic body 11 may be provided to the first and second magnetic bodies 11a and 11b, respectively. Each pairs of the wing-shaped members 112' has substantially the same shape as the right and left wing-shaped sections 112 of each magnetic body 11. The wing-shaped members 112' may be arranged on the upper side of the layer having the magnetic path convergence/divergence section 111 with an insulation layer therebetween. The wing-shaped members 112' are arranged to overlap the wing-shaped sections 112 having the same shape, in plain view.

With respect to the insulation layer between the wing-shaped members 112' and the wing-shaped sections 112, within the portion of the insulation layer corresponding to the portion around the side, which faces the axis of symmetry Γ, of the magnetic path convergence/divergence section 111, the insulation layer is formed so that the closer to the magnetic path convergence/divergence section 111, the thinner the thickness of the insulation layer. Therefore, the wing-shaped members 112' are magnetically connected to the side, which faces the axis of symmetry Γ, of the magnetic path convergence/divergence section 111 of the corresponding magnetic body 11.

Figure 36:
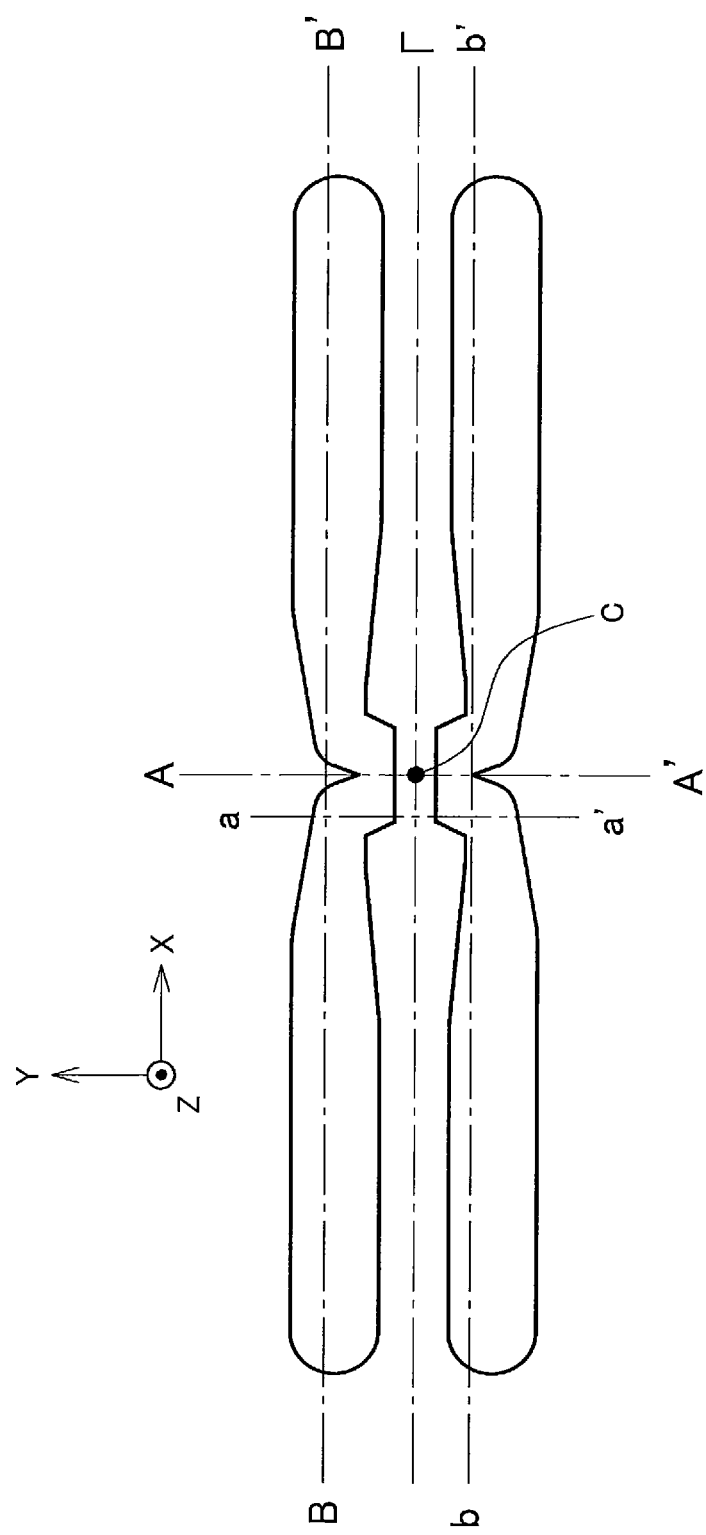
FIG. 36 is an explanatory view showing an example of a multilayered magnetic body of a magnetic sensor device according to an embodiment of the present disclosure.
Figure 37:
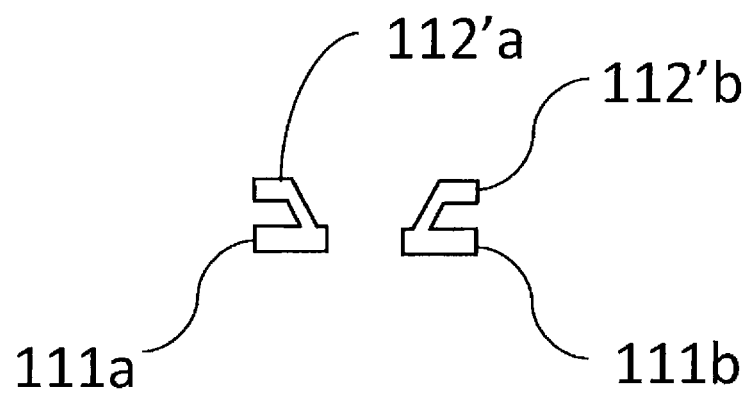
FIG. 37 is a cross-sectional view showing an example of a multilayered magnetic body of a magnetic sensor device according to an embodiment of the present disclosure.
Figure 38:
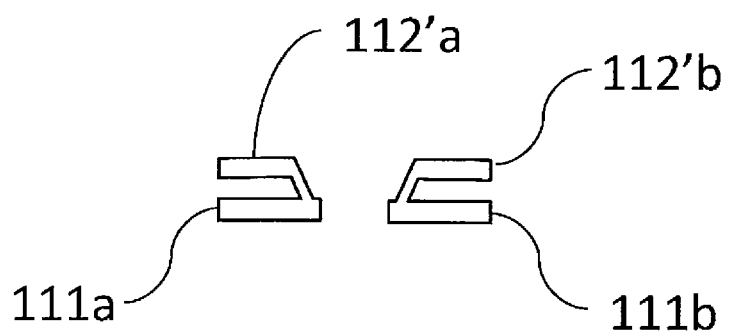
FIG. 38 is another cross-sectional view showing an example of a multilayered magnetic body of a magnetic sensor device according to an embodiment of the present disclosure.
Figure 39:
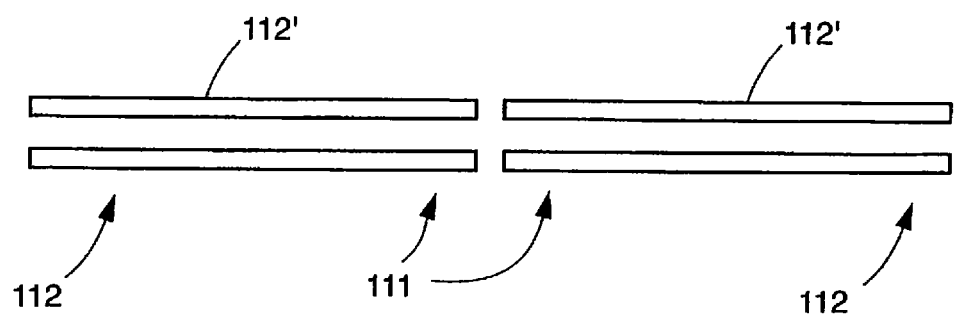
FIG. 39 is another view showing an example of a multilayered magnetic body of a magnetic sensor device according to an embodiment of the present disclosure.

Specifically, as shown in FIG. 36, in the plain view, the magnetic body 11 comprising four wing-shaped members 112' (one pair for each of the first and second magnetic bodies 11a and 11b) is not different in the example shown in FIG. 24. FIG. 37 shows a cross-sectional view of the magnetic body 11 cut in the Y-axis direction along the plane including the point of symmetry C. FIG. 38 shows a cross-sectional view of the magnetic path convergence/divergence section 111 cut in the Y-axis direction near the boundary to the wing-shaped section 112. FIG. 39 shows a cross-sectional view cut in the X-axis direction along the plane near the center of wing-shaped section 112.

Figure 40:
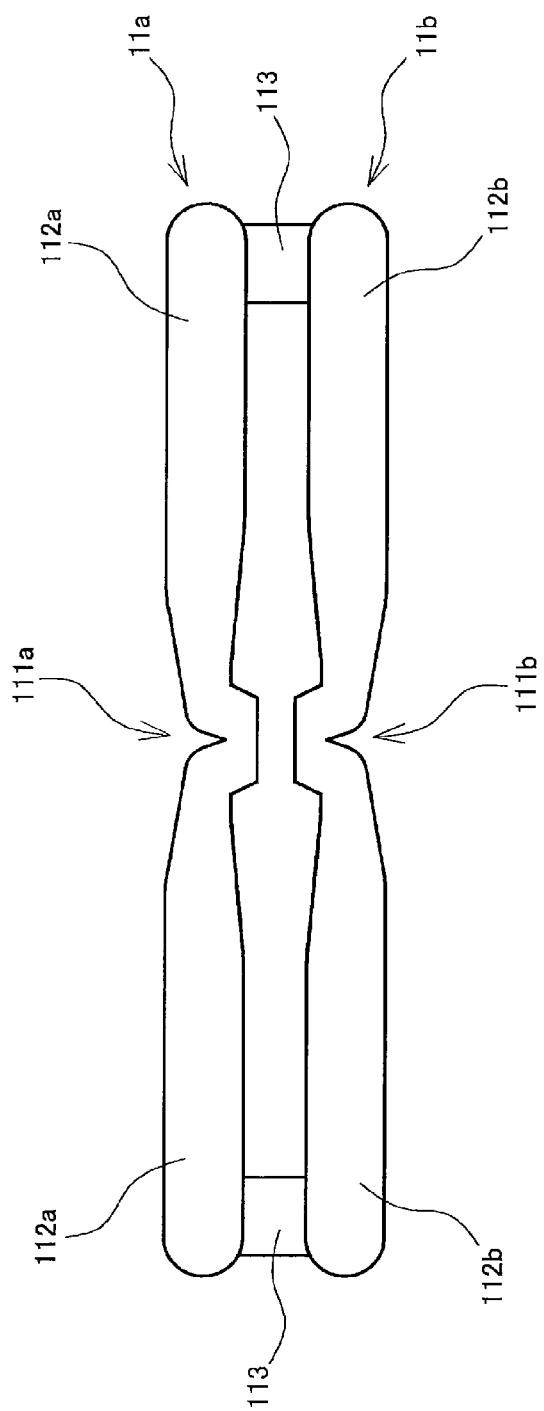
FIG. 40 is an explanatory view showing still another example of a magnetic body of a magnetic sensor device according to an embodiment of the present disclosure.

According to the explanation so far, there are magnetic gaps between the facing ends (left ends and right ends), with the axis of symmetry Γ therebetween, of the wing-shaped sections 112a and 112b of the first and second magnetic bodies 11a and 11b, the magnetic gaps functioning as magnetic saturation suppression sections for suppressing the magnetic saturation of the wing-shaped sections. However, in the present embodiment, the magnetic saturation suppression section does not have to be such a gap. According to an example of the present embodiment, as exemplified in FIG. 40, the magnetic body may have a shape wherein the ends, which face with the axis of symmetry Γ therebetween, of the wing-shaped sections 112a and 112b of the first and second magnetic bodies 11a and 11b are connected by films functioning as magnetic saturation suppression sections 113, the film being composed of a material having a comparative low magnetic permeability, and a large magnetic flux density, such as, $Co_{50}Fe_{50}$. The $Co_{50}Fe_{50}$ film has a Bs of 2.4 T, and a magnetic permeability of about one-tenth permalloy. Further, for the magnetic saturation suppression section 113, a thin film made of a material having a high saturation magnetic flux density and being comparatively hard to be saturated, can be used.

Figure 41:
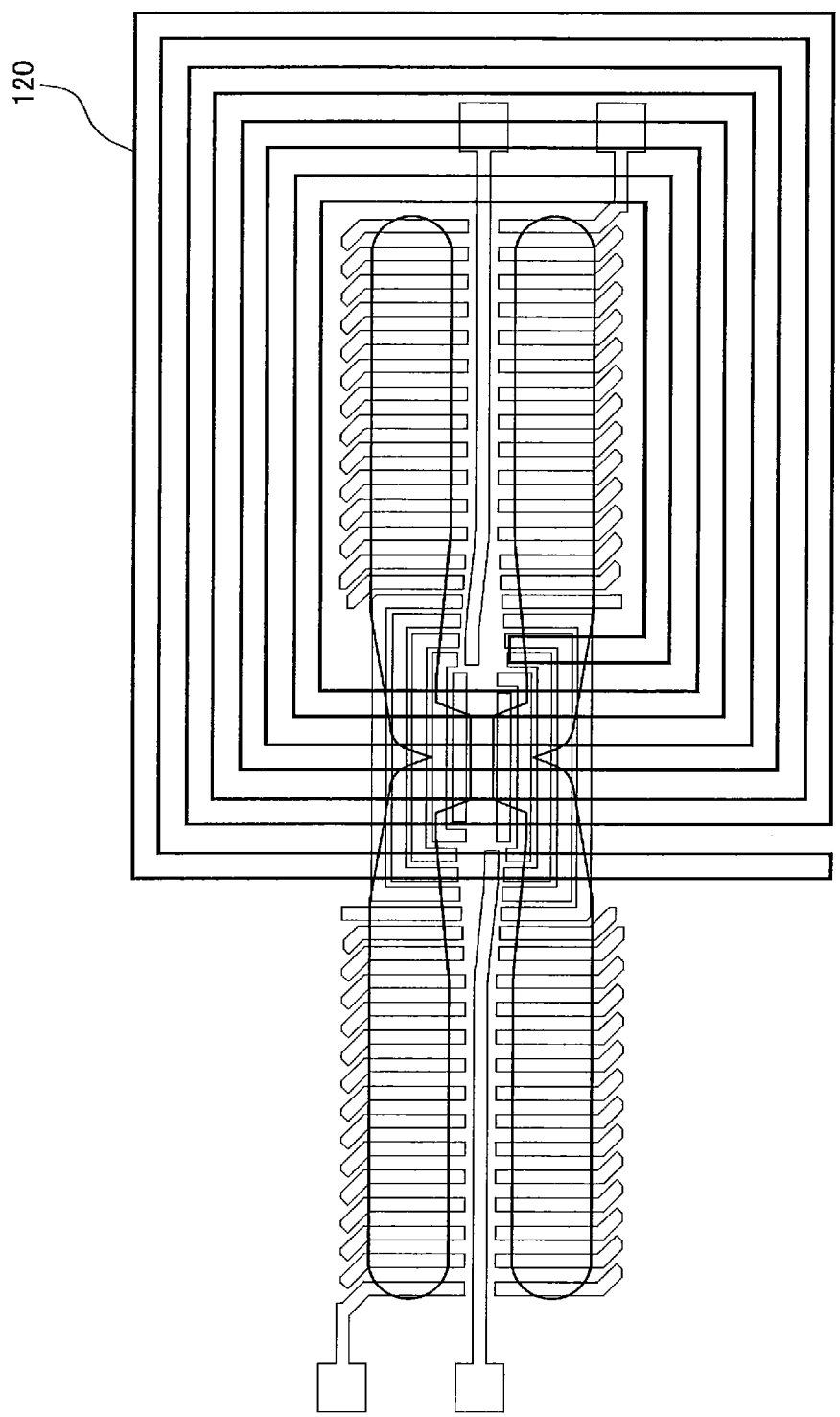
FIG. 41 is an explanatory view showing an example of a coil which can be stacked on a magnetic sensor device according to an embodiment of the present disclosure.

Further, according to the present embodiment, as exemplified in FIG. 41, a thin-film-like spiral coil 120 may be stacked on the magnetic sensor device 1 within the XY plane. In this case, the spiral coil 120 may be arranged so that the portion substantially parallel with the Y-axis direction is located near the magnetoresistance effect element 12. By supplying a predetermined current to the spiral coil 120, a bias magnetic field along the X-axis direction (oriented in reverse with respect to the direction of the magnetic field to be measured) can be applied to the magnetoresistance effect element.

In the examples of Type 2 or Type 3, similar to the example shown in FIG. 19, the magnetoresistance effect element 12 may be arranged with its magnetic sensing direction (magnetization direction of the fixed layer) not aligned with the Y-axis direction, but aligned with the X-axis direction. In this case, as exemplified in FIG. 19(a), a pair of magnetoresistance effect elements 12 (with their longitudinal directions in the Y-axis direction) may be aligned with the Y-axis direction (the direction of the magnetic field to be measured) while the magnetization directions of the fixed layers are reversed from each other. As exemplified in FIG. 19(b), a pair of magnetoresistance effect elements 12 (with their longitudinal directions in the Y-axis direction) may be juxtaposed in the X-axis direction (the direction perpendicular to the magnetic field to be measured) while the magnetization directions of the fixed layers are reversed from each other.

EXAMPLES

Figure 22:
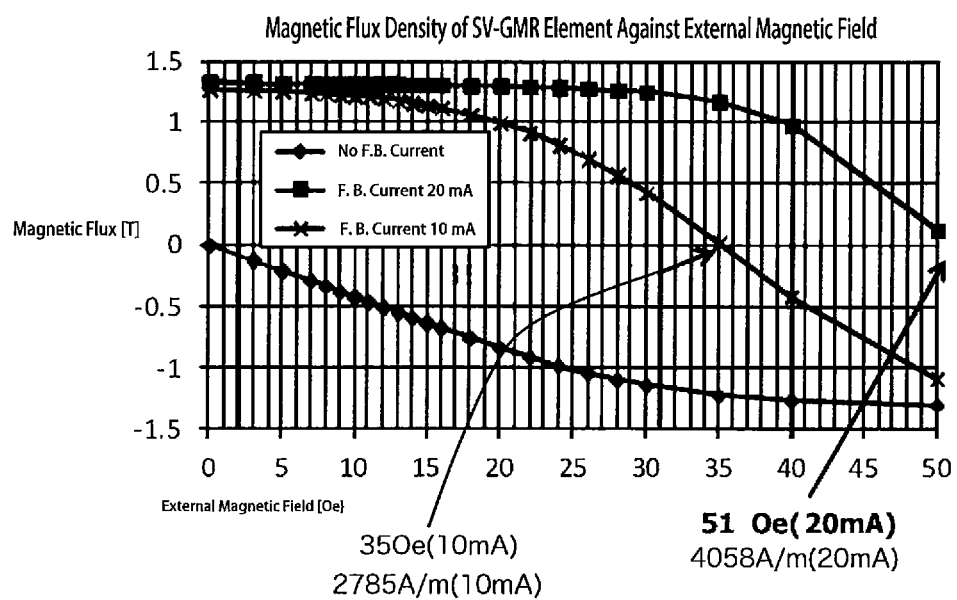
FIG. 22 is an explanatory view showing an example of the change in magnetic flux density within a magnetoresistance effect element relative to the intensity of a magnetic field to be measured by a magnetic sensor device according to an embodiment of the present disclosure.

With respect to the magnetic sensor device 1 according to the present embodiment exemplified in FIG. 2, an SVGMR element was used for the magnetoresistance effect element 12, and the magnetic flux densities within the SVGMR element were measured while the intensity of the magnetic field to be measured was changed from 0 to about 3978 A/m (50 Oe), as the results are shown in FIG. 22.

As exemplified in FIG. 22, according to the present example, compared to the case where no feedback current (F.B. current) is applied, when a feedback current is 10 mA, the operation range was increased to about 1591 A/m (20 Oe), and when the feedback current is 20 mA, the operation range was increased to about 3182 A/m (40 Oe). This means that the measurement magnetic fluxes can be prevented from being concentrated on the magnetic sensing element, and the intensity of the magnetic field at which the magnetic saturation occurs can be increased, leading to the expansion of the range where no magnetic saturation takes place, and the increase in the measurement accuracy.

Figure 23:
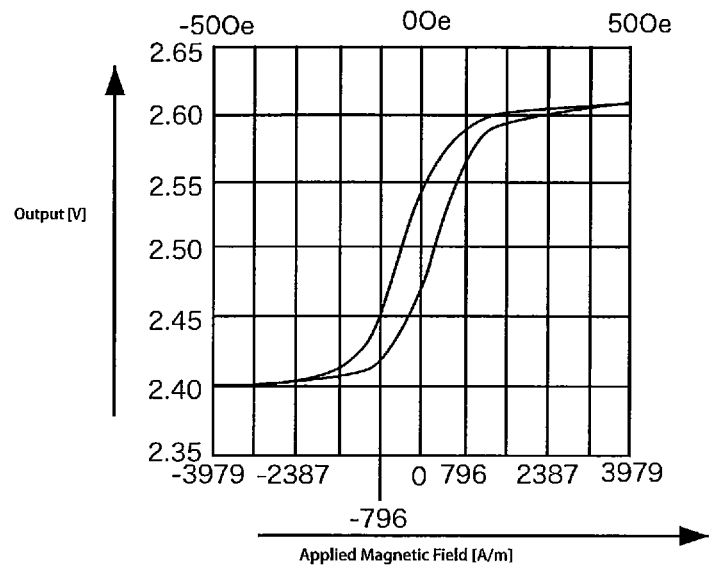
FIG. 23 is an explanatory view showing an example of magnetoresistance change rate by a magnetic sensor device according to an embodiment of the present disclosure.
Figure 23:
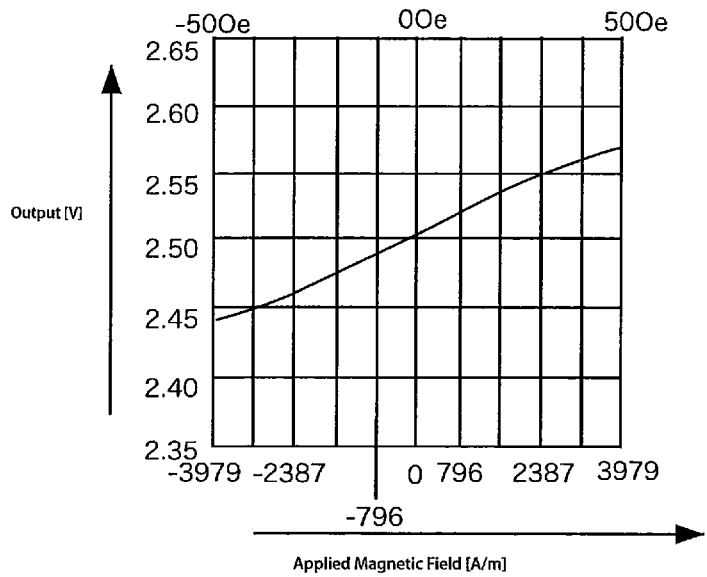

Further, FIG. 23 shows magnetic resistance change rate dR/R of the magnetic sensor device 1 exemplified in FIG. 16. It was confirmed that, with respect to the magnetic sensor device 1 exemplified in FIG. 16, compared to the case when no bias magnetic field was present (FIG. 23(a)), when a bias magnetic field of about 3978 A/m (50 Oe) was applied, the hysteresis was decreased, the range showing the linear change was expanded, and operation range can be expanded (FIG. 23(b)).

Also, according to the present embodiment, with a comparatively low current consumption, a necessary magnetic field can be applied to the magnetoresistance effect element 12, the range of detectable intensity of the magnetic field can be expanded.

Figure 42:
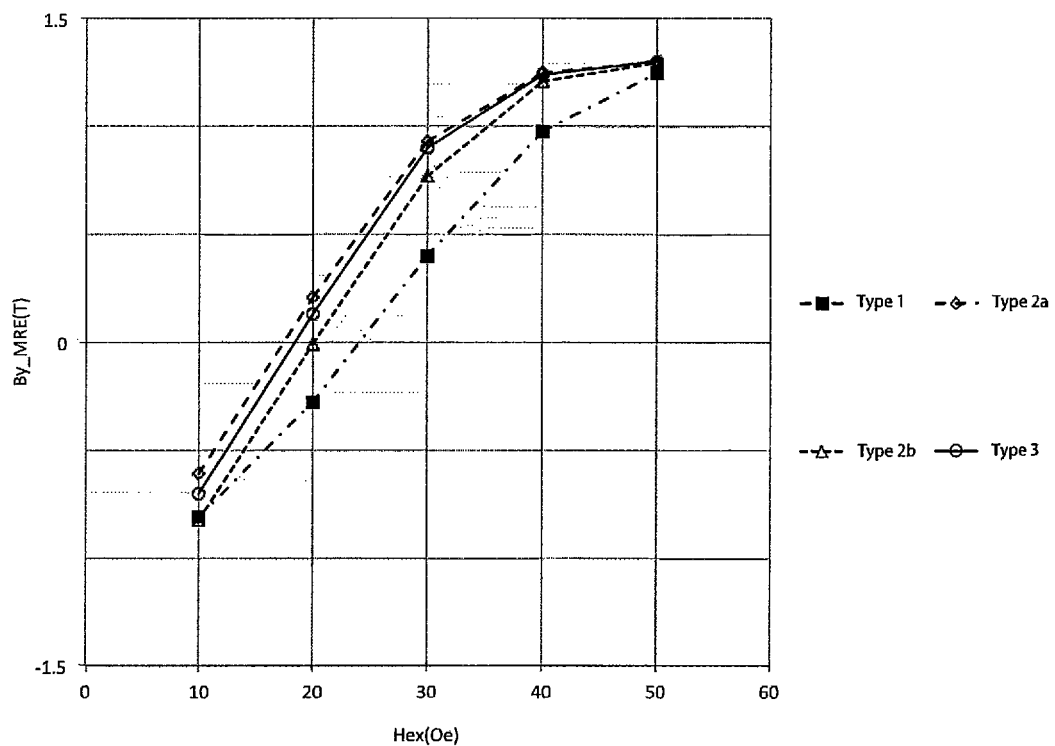
FIG. 42 is an explanatory view showing an example of the change in flux density within a magnetoresistance effect element relative to the intensity of the magnetic field to be measured by a magnetic sensor device according to an embodiment of the present disclosure.

FIG. 42 shows the magnetic flux densities By_MRE(T) in the Y-axis direction within the magnetoresistance effect element 12, relative to the external magnetic field Hex (horizontal axis), regarding magnetic sensor devices 1 which are Type 1 exemplified in FIG. 2, Type 2 exemplified in FIG. 24, and Type 3 exemplified in FIG. 28. In FIG. 42, two cases are referred to as Type 2, in which the length of the wing-shaped section in the X-axis direction is shorter in Type 2a than Type 2b. FIG. 42 will be explained. While a constant feedback current was applied to the coil and the measurement magnetic field Hex was changed, the point at which the magnetic flux density within the element in the Y-axis direction was zero, was defined as a feedback possible magnetic field. The feedback current was 10 mA.

According to the present embodiment, the consumption current can be reduced, compared to the current sensor using a magnetic material frame other than a thin film. With Type 1 magnetic sensor device 1, a larger external magnetic field Hex can be cancelled, and a wider range of the magnetic field can be detected, compared to Type 2/Type 3 magnetic sensor device 1.

This means that Type 1 magnetic sensor device 1 can be operated by a lower consumption current than Type 2/Type 3 magnetic sensor device 1. On the other hand, as can be understood by referring to the magnetic flux density distribution plot (contour plot) at the time of magnetic equilibrium shown in FIG. 44, Type 2 magnetic sensor device 1 provided with the magnetic saturation suppression section has a comparatively low occurrence of magnetic saturation, and thus, can achieve an increased measurement accuracy.

EXPLANATION ON NUMERALS

1 magnetic sensor device, 10 substrate, 11 magnetic body, 12 magnetoresistance effect element, 13 coil, 14 comparator, 15 reference supply, 16 fixed resistor, 21 insulation layer, 22 insulation film, 23 resin, 41 waveform shaping unit, 42 LPF, 111 magnetic path convergence/divergence section, 112 wing-shaped section, 113 magnetic saturation suppression section

The invention claimed is:

1. A magnetic sensor device comprising,
a thin film first magnetic body provided with a magnetic path convergence or divergence section arranged on a predetermined axis, and at least a pair of wing-shaped sections extending from the magnetic path convergence or divergence section toward the opposite sides of said axis,
a thin film second magnetic body provided with a magnetic path convergence or divergence section arranged on said predetermined axis to be spaced from the magnetic path convergence or divergence section of the first magnetic body, at least a pair of wing-shaped sections extending from this magnetic path convergence or divergence section toward the opposite sides of said axis,
a first coil wound around the first magnetic body,
a second coil wound around the second magnetic body, and
a magnetoresistance effect element arranged between the magnetic path convergence or divergence sections of the first magnetic body and the second magnetic body, wherein,
the first coil applies a magnetic field to a magnetic path of the first magnetic body, the magnetic path converging to or diverging from the at least a pair of wing-shaped sections of the first magnetic body to or from the magnetic path convergence or divergence section,
the second coil applies a magnetic field to a magnetic path of the second magnetic body, the magnetic path diverging from or converging to the magnetic path convergence or divergence section to or from the at least a pair of wing-shaped sections of the first magnetic body,
a converged magnetic field is applied to the magnetoresistance effect element along a converged magnetic path, and
a magnetic saturation suppression section which suppresses magnetic saturation of each wing-shaped section, is formed between each wing-shaped section of the first magnetic body and each wing-shaped section, located on the corresponding side, of the second magnetic body.

2. A magnetic sensor device set forth in claim 1, wherein the magnetic saturation suppression section is formed by a nonmagnetic member.

3. A magnetic sensor device set forth in claim 1, wherein each of the magnetic path convergence or divergence sections of the first and second magnetic bodies comprises a convex portion on the side facing to each other on said axis, and a concave portion on the side opposite to the side having the convex portion on said axis.

4. A magnetic sensor device set forth in claim 1, wherein the first coil and the second coil each comprises a plurality of coil elements, and inclinations of the magnetization directions formed by the adjacent coil elements are different from each other.

\* \* \* \* \*